(12) United States Patent
Kagaya et al.

(10) Patent No.: US 11,224,120 B2
(45) Date of Patent: *Jan. 11, 2022

(54) PRINT CIRCUIT BOARD, OPTICAL MODULE, AND OPTICAL TRANSMISSION EQUIPMENT

(71) Applicant: Lumentum Japan, Inc., Kanagawa (JP)

(72) Inventors: Osamu Kagaya, Tokyo (JP); Koyu Takahashi, Kanagawa (JP); Yoshikuni Uchida, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 56 days.

This patent is subject to a terminal disclaimer.

(21) Appl. No.: 16/796,040

(22) Filed: Feb. 20, 2020

(65) Prior Publication Data

US 2020/0196438 A1 Jun. 18, 2020

Related U.S. Application Data

(63) Continuation of application No. 15/835,532, filed on Dec. 8, 2017, now Pat. No. 10,609,812.

(30) Foreign Application Priority Data

Dec. 19, 2016 (JP) .............................. JP2016-245394

(51) Int. Cl.
*H05K 1/02* (2006.01)
*G02B 6/42* (2006.01)
(Continued)

(52) U.S. Cl.
CPC ......... *H05K 1/0228* (2013.01); *G02B 6/4279* (2013.01); *G02B 6/4281* (2013.01);
(Continued)

(58) Field of Classification Search
CPC .. H05K 1/0228; H05K 1/0218; H05K 1/0245; H05K 1/181; H05K 9/0049;
(Continued)

(56) References Cited

U.S. PATENT DOCUMENTS 10,609,812 B2 * 3/2020 Kagaya ................ G02B 6/4281
2010/0295646 A1 * 11/2010 Harrison ............... H01F 41/046
336/192

(Continued)

FOREIGN PATENT DOCUMENTS

CN 103269562 A 8/2013
JP 2012227887 A 11/2012
(Continued)

OTHER PUBLICATIONS

Liu, Qian, "Reduction of EMI due to common mode current using common mode filter or lossy material", Submitted as a masters thesis for the Missouri University of Science and Technology, Jan. 2016 (Year: 2016).*

(Continued)

*Primary Examiner* — Hafizur Rahman
(74) *Attorney, Agent, or Firm* — Harrity & Harrity, LLP

(57) ABSTRACT

Provided is a print circuit board including: a ground conductor layer; a pair of strip conductors extending along a first orientation; a first resonator conductor three-dimensionally intersecting with the pair of strip conductors along a second orientation; a pair of first via holes connecting the first resonator conductor and the ground conductor layer; and a dielectric layer including the first resonator conductor therein, and being disposed between the ground conductor layer and the pair of the strip conductors. A distance $H_1$ between the pair of strip conductors and the ground conductor layer is twice or more a distance $H_2$ between the pair of strip conductors and the first resonator conductor, and a (Continued)

line length L of the first resonator conductor is 0.4 wavelength or more and 0.6 wavelength or less at a frequency corresponding to the bit rate.

20 Claims, 19 Drawing Sheets

(51) Int. Cl.

| | |
|---|---|
| *H01P 7/08* | (2006.01) |
| *H01P 3/08* | (2006.01) |
| *H05K 1/18* | (2006.01) |
| *H05K 9/00* | (2006.01) |
| *H04B 10/50* | (2013.01) |
| *H01P 3/02* | (2006.01) |
| *H01P 1/203* | (2006.01) |
| *H05K 1/11* | (2006.01) |
| *H05K 1/14* | (2006.01) |

(52) U.S. Cl.
CPC ........ *G02B 6/4284* (2013.01); *H01P 1/20381* (2013.01); *H01P 3/026* (2013.01); *H01P 3/081* (2013.01); *H01P 7/086* (2013.01); *H04B 10/501* (2013.01); *H05K 1/0218* (2013.01); *H05K 1/0245* (2013.01); *H05K 1/181* (2013.01); *H05K 9/0049* (2013.01); *H05K 9/0058* (2013.01); *G02B 6/4277* (2013.01); *G02B 6/4292* (2013.01); *H05K 1/115* (2013.01); *H05K 1/147* (2013.01); *H05K 2201/093* (2013.01); *H05K 2201/09272* (2013.01); *H05K 2201/10121* (2013.01)

(58) Field of Classification Search
CPC ...... H05K 9/0058; H05K 1/115; H05K 1/147; H05K 2201/09272; H05K 2201/093; H05K 2201/10121; G02B 6/4279; G02B 6/4281; G02B 6/4284; G02B 6/4277; G02B 6/4292; H01P 1/20381; H01P 3/026; H01P 3/081; H01P 7/086; H04B 10/501
USPC ......................................................... 333/219
See application file for complete search history.

(56) References Cited

U.S. PATENT DOCUMENTS

| | | |
|---|---|---|
| 2011/0032048 A1 | 2/2011 | Wu et al. |
| 2011/0298563 A1 | 12/2011 | Pai et al. |
| 2012/0098627 A1 | 4/2012 | Kameya |
| 2012/0269522 A1 | 10/2012 | Kagaya |
| 2014/0240056 A1 | 8/2014 | Isom et al. |
| 2017/0099728 A1 | 4/2017 | Janssen et al. |
| 2018/0177042 A1 | 6/2018 | Kagaya et al. |

FOREIGN PATENT DOCUMENTS

| | | |
|---|---|---|
| TW | 201106387 A | 2/2011 |
| WO | 2011004453 A1 | 1/2011 |
| WO | 2014133513 A1 | 9/2014 |
| WO | 2015158726 A1 | 10/2015 |

OTHER PUBLICATIONS

Carsten P., "The Why and How of Differential Signaling", Published in All About Circuits on Nov. 16, 2016, pp. 2-3.

Chinese Office Action received in corresponding Chinese Application No. CN201711295377.4, dated Mar. 4, 2019, 10 pages.

Chuang H., et al., "A New Common-mode EMI Suppression Technique for GHz Differential Signals Crossing Slotted Reference Planes", IEEE International Symposium on Electromagnetic Compatibility, 2010, pp. 12-15.

Fernandez-Prieto A., et al., "Common-mode Suppression for Balanced Bandpass Filters in Multilayer Liquid Crystal Polymer Technology", Institution of Engineering and Technology IET Journal on Microwaves, Antennas & Propagation, 2015, vol. 9 (12), pp. 1249-1253.

Liu Q., et al., "PCB Structures for Common Mode Suppression on Differential Microstrip Lines," in IEEE International Symposium EMC, Raleigh, NC, Aug. 2014, pp. 533-537.

Su B., et al., "Miniaturized Common-Mode Filter Using Coupled Synthesized Lines and Mushroom Resonators for High-Speed Differential Signals", IEEE Microwave and Wireless Components Letters, Feb. 2015, vol. 25 (2), pp. 112-114.

* cited by examiner

PRINT CIRCUIT BOARD, OPTICAL MODULE, AND OPTICAL TRANSMISSION EQUIPMENT

CROSS-REFERENCE TO RELATED APPLICATION

This application is a continuation of U.S. patent application Ser. No. 15/835,532, filed Dec. 8, 2017, which claims priority from Japanese application JP 2016-245394, filed on Dec. 19, 2016, the content contents of which are hereby incorporated by reference into this application.

BACKGROUND OF THE INVENTION

1. Field of the Invention

The present invention relates to a print circuit board, an optical module, and an optical transmission equipment, and in particular, to the print circuit board in which unnecessary electromagnetic waves propagating to a differential transmission line of a micro-strip line type are suppressed.

2. Description of the Related Art

In a print circuit board, a differential transmission line transmitting a serial data signal may be formed in some cases. Unnecessary high frequency noise may occur in such a differential transmission line.

For such high frequency noise, a method of selectively inhibiting conduction propagation of a common mode signal component without having a bad influence on the differential signal component conducting and propagating the differential transmission line (without deteriorating differential signal quality) has been proposed. WO 2011/004453 A1 and JP 2012-227887A disclose a configuration in which a resonator is connected to a ground conductor layer through a via hole in which a rectangular conductor film is disposed at the center thereof, and the resonator is coupled by disposing the resonator below the differential transmission line. In US 2011/0298563 A1 discloses a configuration in which a resonator is configured by providing a plurality of spiral opening portions (slots) in the ground conductor layer and disposing the opening portions on both sides of the differential transmission line to connect both portions at opening portion on the line, and the resonator is coupled to a differential transmission line.

SUMMARY OF THE INVENTION

It is desirable to selectively inhibit conduction propagation of the common mode signal component transmitted to a differential transmission line in a desired frequency domain. Therefore, it is conceivable to couple a resonator structure to the differential transmission line. Here, the resonator structure is configured to include a ground conductor layer, a resonator conductor, and a pair of via holes connecting the resonator conductor and the ground conductor layer. However, the resonator conductor and the pair of the via holes are formed in separate steps. Therefore, due to a positional deviation of the pair of the via holes with respect to the resonator conductor, a frequency domain of a common mode signal component which can be inhibited varies. If it is difficult to selectively inhibit the conduction propagation of the common mode signal component in the desired frequency domain due to variation of the frequency domain, the yield is reduced.

The present invention has been made in view of the above problems, and it is an object to provide a print circuit board, an optical module, and an optical transmission equipment which can selectively inhibit transmission propagation of a common mode signal component to a differential transmission line.

(1) According to an aspect of the present invention, there is provided a print circuit board including a ground conductor layer, a pair of strip conductors that is disposed on a board surface side in a lamination orientation of the ground conductor layer and extends along a first orientation, a first resonator conductor that is disposed between the ground conductor layer and the pair of the strip conductors, and three-dimensionally intersects with the pair of strip conductors along a second orientation intersecting the first orientation, a pair of first via holes that respectively connects the first resonator conductor and the ground conductor layer, and a dielectric layer that includes the first resonator conductor therein, and is disposed between the ground conductor layer and the pair of the strip conductors, in which in a differential transmission line of a micro-strip line type in which a digital modulation signal is transmitted is configured to include the ground conductor layer, the pair of the strip conductors, and the dielectric layer, a first resonator structure is configured to include the ground conductor layer, the first resonator conductor, and the pair of first via holes, a distance $H_1$ along the lamination orientation between the pair of strip conductors and the ground conductor layer is twice or more a distance $H_2$ along the lamination orientation between the pair of strip conductors and the first resonator conductor, and in the first resonator conductor, a line length L of the first resonator conductor from the center position of one via hole of the pair of first via holes to the center position of the other via hole is 0.4 wavelength or more and 0.6 wavelength or less at a frequency corresponding to the bit rate of the digital modulation signal to be transmitted.

(2) In the print circuit board according to (1), the first resonator conductor may extend from each of the pair of first via holes to any one of the inside and the outside of the first resonator conductor along the second orientation.

(3) In the print circuit board according to (1), the first resonator conductor may extend from each of the pair of first via holes to any one of the inside and the outside of the first resonator conductor along the second orientation, and further bend in any one direction of the first orientation.

(4) In the print circuit board according to (1), the first resonator conductor may extend outward along the second orientation from a portion in which the first resonator conductor three-dimensionally intersects with the pair of strip conductors, bend in any one direction of the first orientation, further extend along the first orientation, bends to the outside in the second orientation, and extend along any one of the outside and the inside along the second orientation to connect with the pair of first via holes.

(5) In the print circuit board according to any one of (1) to (4), the first resonator conductor may have a shape that is substantially line symmetric with respect to the pair of strip conductors in a plan view.

(6) In the print circuit board according to any one of (1) to (5), further including a second resonator conductor that is disposed in the same layer as the first resonator conductor, and three-dimensionally intersects with the pair of strip conductors along the second orientation, and a pair of second via holes that respectively connects the second resonator conductor and the ground conductor, a second resonator structure may be configured to include the ground conductor layer, the second resonator conductor, and the pair of second via holes, and in the second resonator conductor, a line length L of the second resonator conductor from the center position of one via hole of the pair of second via holes to the center position of the other via hole may be 0.4 wavelength or more and 0.6 wavelength or less at a frequency corresponding to the bit rate of the digital modulation signal to be transmitted.

(7) In the print circuit board according to (4), further including a second resonator conductor that is disposed in the same layer as the first resonator conductor, and three-dimensionally intersects with the pair of strip conductors along the second orientation, and a pair of second via holes that respectively connects the second resonator conductor and the ground conductor, a second resonator structure may be configured to include the ground conductor layer, the second resonator conductor, and the pair of second via holes, in the second resonator conductor, a line length L of the second resonator conductor from the center position of one via hole of the pair of second via holes to the center position of the other via hole may be 0.4 wavelength or more and 0.6 wavelength or less at a frequency corresponding to the bit rate of the digital modulation signal to be transmitted, and the second resonator conductor may extend outward along the second orientation from a portion in which the second resonator conductor in parallel with the first resonator conductor three-dimensionally intersects with the pair of strip conductors, bend in the other direction of the first orientation, further extend away from the first resonator conductor along the first orientation, bend to the outside in the second orientation, and extend along anyone of the outside and the inside along the second orientation to connect with the pair of second via holes.

(8) According to another aspect of the present invention, there is provided a print circuit board including a ground conductor layer, a pair of strip conductors that is disposed on a board surface side in a lamination orientation of the ground conductor layer and extends along a first orientation, a first resonator conductor that is disposed on the board surface side in a lamination orientation of the pair of strip conductors, and three-dimensionally intersects with the pair of strip conductors along a second orientation intersecting the first orientation, a pair of first via holes that respectively connects the first resonator conductor and the ground conductor layer, and a dielectric layer that includes the pair of strip conductors therein, and is disposed between the ground conductor layer and the first resonator conductor, a differential transmission line of a micro-strip line type in which a digital modulation signal is transmitted may be configured to include the ground conductor layer, the pair of the strip conductors, and the dielectric layer, a first resonator structure may be configured to include the ground conductor layer, the first resonator conductor, and the pair of first via holes, a distance $H_1$ along the lamination orientation between the pair of strip conductors and the ground conductor layer may be twice or more a distance $H_2$ along the lamination orientation between the pair of strip conductors and the first resonator conductor, and in the first resonator conductor, a line length L of the first resonator conductor from the center position of one via hole of the pair of first via holes to the center position of the other via hole may be 0.4 wavelength or more and 0.6 wavelength or less at a frequency corresponding to the bit rate of the digital modulation signal to be transmitted.

(9) In the print circuit board according to any one of (1) to (8), an angle between the first orientation and the second orientation may be 85° or more and 90° or less.

(10) In the print circuit board according to any one of (1) to (9), the first orientation and the second orientation may be substantially orthogonal to each other.

(11) According to still another aspect of the present invention, there is provided an optical module including the print circuit board according to any one of (1) to (10), the print circuit board further may include an IC that drives the digital modulation signal.

(12) In the optical module according to (11), a metal housing that covers the print circuit board to configure an electromagnetic shield, and includes an opening portion for exposing a portion of the print circuit board to an outside may be further included.

(13) According to still another aspect of the present invention, there is provided an optical transmission equipment on which the optical module according to (11) or (12) may be mounted.

(14) According to still another aspect of the present invention, there is provided an optical transmission equipment including the print circuit board according to any one of (1) to (10), the print circuit board may further include an IC that drives the digital modulation signal.

According to the present invention, a print circuit board, an optical module, and an optical transmission equipment which can selectively inhibit transmission propagation of a common mode signal component to a differential transmission line are provided.

DETAILED DESCRIPTION OF THE INVENTION

Figure 1:
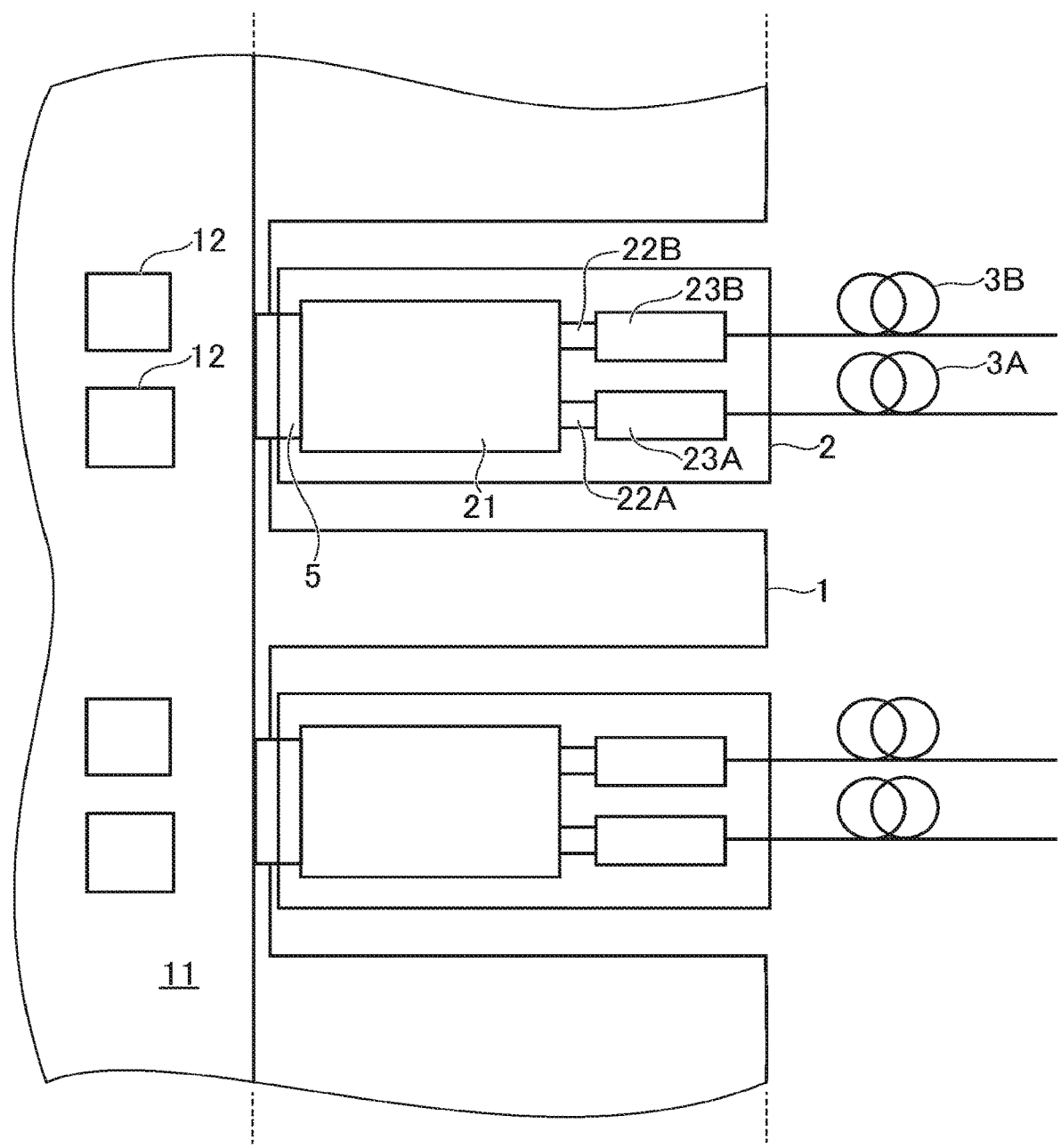
FIG. 1 is a schematic view illustrating a configuration of an optical transmission equipment and an optical module according to a first embodiment of the present invention.

Hereinafter, embodiments of the present invention will be described specifically and in detail with reference to the drawings. In all the drawings for describing the embodiments, the same reference numerals are given to the members having the same function, and the repeated description thereof will be omitted. The drawings illustrated below merely illustrate examples of the embodiments, and the sizes of the drawings and the scales described in the embodiments do not necessarily coincide with each other.

First Embodiment

FIG. 1 is a schematic view illustrating a configuration of an optical transmission equipment 1 and an optical module 2 according to a first embodiment of the present invention. The optical transmission equipment 1 includes a print circuit board 11. In addition, the optical module 2 includes a print circuit board 21. The print circuit board according to the first embodiment is one or both of the print circuit boards 11 and 21.

The optical transmission equipment 1 further includes an IC 12. The optical transmission equipment 1 is, for example, a large-capacity router or a switch. The optical transmission equipment 1 has, for example, a function of a switching equipment, and is disposed in a base station or the like. The optical transmission equipment 1 acquires data for receiving (electric signal for receiving) from the optical module 2, determines to transmit what data to where using the IC 12 or the like, generates data for transmitting (electric signal for transmitting), and transmits the data to the corresponding optical module 2 through the print circuit board 11.

The optical module 2 is a transceiver having a function of optical transmitting and a function of optical receiving, and includes a ROSA 23A which converts an optical signal received through an optical fiber 3A into an electric signal, and a TOSA 23B which converts an electric signal to an optical signal and transmits the optical signal to an optical fiber 3B. The print circuit board 21, the ROSA 23A and the TOSA 23B are connected to each other through flexible boards 22A and 22B (flexible printed circuit: FPC), respectively. An electric signal is transmitted from the ROSA 23A to the print circuit board 21 through the flexible board 22A, and an electric signal is transmitted from the print circuit board 21 to the TOSA 23B through the flexible board 22B. The optical modules 2 and the optical transmission equipment 1 are connected to each other through an electrical connector 5. The ROSA 23A and the TOSA 23B are electrically connected to the print circuit board 21 and are optical elements that convert from one to the other of optical signals or electric signals.

A transmission system according to the first embodiment includes two or more of the optical transmission equipment 1, two or more of the optical modules 2, and one or more of optical fibers 3. Each optical transmission equipment 1 is mounted on one or more of the optical modules 2. The optical fiber 3 is connected between the optical modules 2 mounted on the two optical transmission equipments 1, respectively. Transmission data generated by one of the optical transmission equipment 1 is converted into an optical signal by the mounted optical module 2, and such an optical signal is transmitted to the optical fiber 3. The optical signal transmitted over the optical fiber 3 is received by the optical module 2 mounted on the other optical transmission equipment 1, and the optical module 2 converts the optical signal into an electric signal and transmits the electric signal to the other optical transmission equipment 1 as reception data.

Here, the bit rate of the electric signal transmitted and received by each of the optical modules 2 is 100 Gbit/s class, and the optical module 2 has a multi-channel system of 4 channels for transmitting and 4 channels for receiving. The bit rate of the electric signal transmitting each channel is any one of 25 Gbit/s to 28 Gbit/s, specifically, the bit rate of the electric signal transmitting each channel is 25.78 Gbit/s. A differential transmission line is a line for propagating an electrical serial data signal with a bit rate of 25.78 Gbit/s.

Figure 2:
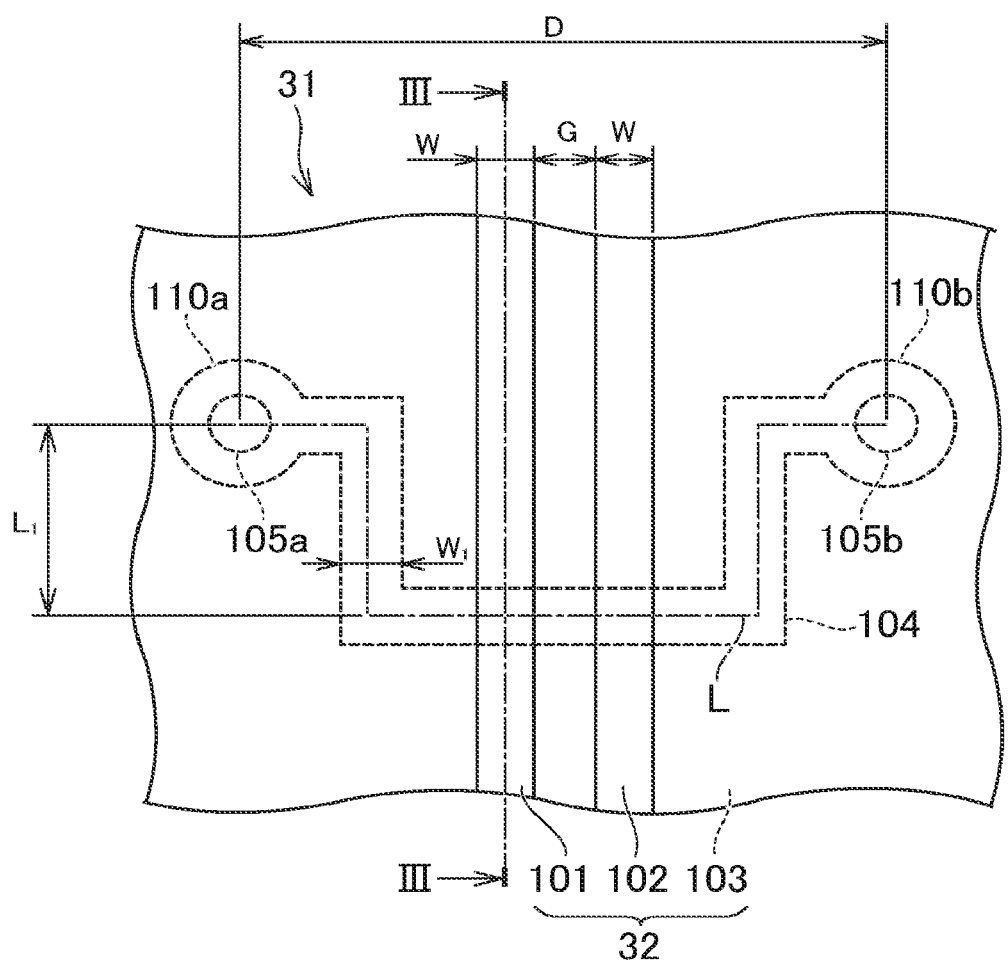
FIG. 2 is a schematic view illustrating a flat surface of a portion of a print circuit board according to the first embodiment of the present invention.
Figure 3:
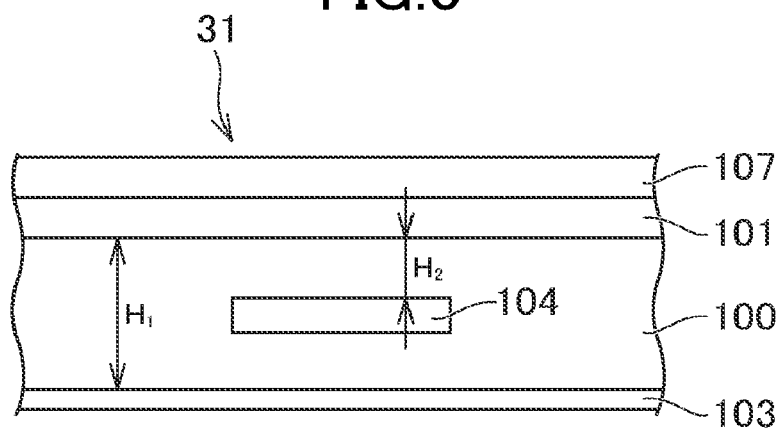
FIG. 3 is a schematic view illustrating a cross section of the portion of the print circuit board according to the first embodiment of the present invention.

FIG. 2 is a schematic view illustrating a flat surface of a portion of a print circuit board 31 according to the first embodiment. FIG. 3 is a schematic view illustrating a cross section of the portion of the print circuit board 31 according to the first embodiment. FIGS. 2 and 3 schematically illustrate the flat surface and the cross section, respectively, in order to understand the structure of the print circuit board 31, so that the actual plan view and sectional view are different from each other. The print circuit board 31 is a print wiring board having a multilayer structure in which a plurality of conductor layers are formed through each of dielectric layers, and in FIGS. 2 and 3, a portion of the print circuit board 31 in which the differential transmission line and the resonator structure are formed (only the upper portion) is illustrated among the multilayer structure. FIG. 3 illustrates a cross section taken along line III-III illustrated in FIG. 2.

The print circuit board 31 according to the first embodiment has a plurality of differential transmission lines for high speed digital signals, and the print circuit board 31 has a plurality of channels. In FIGS. 2 and 3, one differential transmission line 32 (one channel) among the plurality of differential transmission lines is illustrated. Here, the bit rate of the electric signal transmitted to the differential transmission line 32 is 25.78 Gbit/s. Here, the print circuit board 31 is the print circuit board 21 of the optical module 2, but as described above, the print circuit board 11 of the optical transmission equipment 1 may be used.

As illustrated in FIGS. 2 and 3, the print circuit board 31 is provided with a dielectric layer 100, a pair of strip conductors 101 and 102, a ground conductor layer 103, a first resonator conductor 104, and a pair of first via holes 105a, and 105b. Although on the uppermost surface illustrated in FIG. 2, a protective dielectric film 107 is disposed over the entire surface, in order to facilitate understanding of the multilayer structure of the print circuit board 31, the protective dielectric film 107 is omitted. In addition, similarly, the dielectric layer 100 is not illustrated in FIG. 2.

In the dielectric layer 100, a material (glass epoxy resin) including a glass cloth substrate and an epoxy resin is used. For example, the relative dielectric constant of the dielectric layer 100 is 3.5. The dielectric layer 100 includes the first resonator conductor 104 therein, and is disposed between the pair of strip conductors 101 and 102 and the ground conductor layer 103.

The pair of strip conductors 101 and 102 are disposed on the board surface side (upper side in FIG. 3) in the lamination orientation of the ground conductor layer 103, and both extend along a first orientation (vertical orientation illustrated in FIG. 2). The pair of strip conductors 101 and 102 are formed on the uppermost metal layer of the multilayer structure of the print circuit board 31. The pair of strip conductors 101 and 102 are copper foils having a thickness of 37 μm. A width W of the pair of strip conductors 101 and 102 is 0.17 mm, and an interval G between the pair of strip conductors 101 and 102 is 0.20 mm. Here, the interval G is the distance from the inner edge of the strip conductor 101 to the inner edge of the strip conductor 102. It is desirable that the pair of strip conductors 101 and 102 are spaced apart from each other by the interval G, have the width W, and extend in a linear shape in the first orientation in parallel with each other. However, the shapes of the pair of strip conductors 101 and 102 may be bent or the like, depending on the relationship with other components mounted on the print circuit board 31. Even in such a case, in a region three-dimensionally intersecting with the first resonator conductor 104 and a region in the vicinity thereof, the shape may be a parallel linear shape. A planar shape of the pair of strip conductors 101 and 102 is processed and formed by patterning.

The ground conductor layer 103 is a copper foil with a thickness of 18 μm and is a third metal layer counted from the front surface side among the multilayer structure of the print circuit board 31. As illustrated in FIG. 3, the distance $H_1$ between the pair of strip conductors 101 and 102 and the ground conductor layer 103 is 166 μm. Here, the distance $H_1$ between the pair of strip conductors 101 and 102 and the ground conductor layer 103 is the distance between the lower surface of the pair of strip conductors 101, 102 and the upper surface of the ground conductor layer 103. The differential transmission line 32 of a micro-strip line type, through which a digital modulation signal is transmitted is configured by the dielectric layer 100, the pair of strip conductors 101 and 102, and the ground conductor layer 103. The characteristic impedance of the differential transmission line 32 in the differential mode can be made 100Ω. Although it is desirable that the ground conductor layer 103 is disposed over the entire surface of the print circuit board 31, the ground conductor layer 103 may have a shape including a region below the pair of strip conductors 101 and 102 and the first resonator conductor 104 and extending to both sides in the second orientation. The second orientation is an orientation intersecting the first orientation.

The first resonator conductor 104 is disposed between the pair of strip conductors 101 and 102 and the ground conductor layer 103. The first resonator conductor 104 is a copper foil with a thickness of 36 μm and is a second metal layer counted from the front surface side among the multilayer structure of the print circuit board 31. As illustrated in FIG. 3, the distance $H_2$ between the pair of strip conductors 101 and 102 and the first resonator conductor 104 is 65 μm.

Here, the distance $H_2$ between the pair of strip conductors 101 and 102 and the first resonator conductor 104 is the distance between the lower surface of the pair of strip conductors 101, 102 and the upper surface of the first resonator conductor 104. It is desirable that the distance $H_1$ is twice or more the distance $H_2$, and the print circuit board 31 according to the first embodiment satisfies such a condition.

The first resonator conductor 104 three-dimensionally intersects with the pair of strip conductors 101 and 102 along the second orientation. It is desirable that the angle between the first orientation and the second orientation is 85° or more and 90° or less, and it is further desirable that the first orientation and the second orientation are substantially orthogonal to each other (angle formed is 90°). In the first embodiment, the first orientation (vertical orientation in FIG. 2) and the second orientation (horizontal orientation in FIG. 2) are orthogonal to each other. The first resonator conductor 104 is provided with land portions 110a and 110b (via lands) each having a circular shape (diameter: 0.45 mm) at both ends thereof.

The pair of first via holes 105a and 105b (circular shape) are respectively disposed so that the center of the circular shape is ideally penetrated through the center of the circular shape of the land portions 110a and 110b. Each of the pair of first via holes 105a and 105b is a cylindrical through hole having a diameter of 0.20 mm, and a metal is disposed on the inner wall of the through hole. The distance D between the centers of the pair of first via holes 105a and 105b is 2.0 mm. A circular hole (through hole) is formed in the dielectric layer 100 by a drill step so as to extend from the pair of strip conductors 101 and 102 (uppermost metal layer) to the ground conductor layer 103 (third metal layer) perpendicular to the planar direction of the print circuit board 31, and the pair of first via holes 105a and 105b are formed by copper plating in the inner wall (inside surface) of the hole. The pair of first via holes 105a and 105b connect the first resonator conductor 104 (land portions 110a and 110b at the both ends of) and the ground conductor layer 103, respectively. A first resonator structure is configured to include the ground conductor layer 103, the first resonator conductor 104, and the pair of first via holes 105a and 105b.

As illustrated in FIGS. 2 and 3, the protective dielectric film 107 is the uppermost layer of the print circuit board 31 and is disposed so as to cover the pair of strip conductors 101 and 102 and the dielectric layer 100. The protective dielectric film 107 is a dielectric film called a solder resist for preventing adhesion of solder and has a thickness of approximately 40 μm. The protective dielectric film 107 may not be disposed unless otherwise required.

The first feature of the print circuit board 31 according to the first embodiment lies in the shape of the first resonator conductor 104. The second feature is that the distance $H_1$ is twice or more the distance $H_2$. Hereinafter, the shape of the first resonator conductor 104 will be described. The planar shape of the first resonator conductor 104 is processed and formed by patterning.

The first resonator conductor 104 extends in a linear shape from each of (centers of) the land portions 110a and 110b at both ends along the second orientation to the inside of the first resonator conductor 104. That is, the first resonator conductor 104 extends from each of (centers of) the pair of first via holes 105a and 105b along the second orientation to the inside of the first resonator conductor 104. Here, the description of "to extend to the inside of the first resonator conductor 104" means to extend in an orientation approaching from both sides with respect to the pair of strip conductors 101 and 102 with which the first resonator conductor 104 three-dimensionally intersects. The description of "to extend to the outside of the first resonator conductor 104" means to extend in an orientation away from both sides with respect to the pair of strip conductors 101 and 102 with which the first resonator conductor 104 three-dimensionally intersects. Actually, the planar shape of the first resonator conductor 104 and the pair of first via holes 105a and 105b are formed in separate steps, so that the positional deviation occurs between (centers of) the land portions 110a and 110b and (centers of) the pair of the first via holes 105a and 105b, respectively. Here, the positional deviation amount is 0.125 mm. The diameter 0.45 mm of the land portions 110a and 110b is a value that can correspond to the diameter 0.20 mm of the pair of first via holes 105a and 105b and the positional deviation amount of 0.125 mm. In addition, among the first resonator conductors 104, the width $W_1$ of the portion extending in a linear shape (excluding the bent portion) is 0.20 mm.

Here, the description of "first resonator conductor 104 extends along the second orientation from each of the land portions 110a and 110b or from each of the pair of first via holes 105a and 105b" allows a tolerance in positional deviation on manufacturing, so that the center of the linear shape portion of the first resonator conductor 104 may not strictly extend from the center of the land portions 110a and 110b, and the extending orientation of the linear shape may be along the second orientation and may not be strictly parallel to the second orientation. In this specification, the description of "along the first orientation (or the second orientation)" is the same.

It is desirable that both of the first resonator conductor 104 according to the first embodiment extend along the second orientation from both ends thereof (land portions 110a and 110b) or from each of the pair of first via holes 105a and 105b to the inside of the first resonator conductor 104, and that both further bend in any one direction in the first orientation (downward in FIG. 2). Furthermore, it is desirable that both extend to the inside of the first resonator conductor 104 along the second orientation, and reach the portions three-dimensionally intersecting with the pair of strip conductors 101 and 102. That is, it is desirable that the first resonator conductor 104 extends to the outside along the second orientation from the portions three-dimensionally intersecting with the pair of strip conductors 101 and 102, bends in any one direction in the first orientation (upward in FIG. 2), further extends along the first orientation, bends to the outside in the second orientation, and extends to the outside along the second orientation to connect with the pair of first via holes.

The first resonator conductor 104 according to the first embodiment has a shape extending to the inside along the second orientation from the land portions 110a and 110b disposed at both ends thereof. Since the first resonator conductor 104 has such a shape, it is possible to suppress degradation of characteristics due to the positional deviation between the land portions 110a and 110b and the pair of first via holes 105a and 105b. Details of the effect will be described later. In addition, the first resonator conductor 104 according to the first embodiment has a shape connected to the pair of strip conductors 101 and 102 extending along the first orientation, and to the land portions 110a and 110b which three-dimensionally intersect along the second orientation, respectively extend along the second orientation from a portion three-dimensionally intersects, repeat bending and stretching, and are disposed at both ends thereof. Since the first resonator conductor 104 according to the first embodiment has such a shape, a line length L of the first resonator conductor 104 from the center position of one via hole (for example, via hole 105a) of the pair of first via holes to the center position of the other via hole (for example, via hole 105b) is 3.4 mm. Here, the line length L is the length of the center line of the linear shape in which the first resonator conductor extends, and in the bent portion, the line length L may be calculated based on the center line of the linear shape respectively extending to both sides. As illustrated in FIG. 2, the length $L_1$ of the center line of the linear shape portion extending in the first orientation of the first resonator conductor 104 is 0.7 mm. That is, considering the center line, it is possible to dispose the first resonator conductor 104 having a long line length of 3.4 mm in a small region of 0.7 mm along the first orientation. In addition, it is possible to provide one linear shape portion of 0.7 mm along the first orientation on both sides (two in total), so that these two linear shape portions serve as a detour route, and the linear shape portion along the second orientation can be shortened.

The first resonator conductor 104 is disposed inside the dielectric layer 100 having a relative dielectric constant $\varepsilon_r$ of 3.5, and a wavelength shortening ratio ($1/\sqrt{\varepsilon_r}$) of the dielectric layer 100 with respect to a vacuum is 0.535. One wavelength $\lambda$g of the first resonator conductor 104 at a frequency of 25.78 GHz corresponding to the bit rate is calculated to be 6.22 mm. Therefore, the line length L of 3.4 mm of the first resonator conductor 104 is 0.55 $\lambda$g in terms of the wavelength $\lambda$g. In a case of changing the shape of the first resonator conductor 104, in a case of changing the distance between the first resonator conductor 104 and the ground conductor layer 103, and in a case of changing the material of the dielectric layer 100, an appropriate value of the line length L of the first resonator conductor 104 may be selected according to the case. The appropriate value can be obtained by, for example, an electromagnetic field analysis tool, and desirably has a length of 0.4 wavelength or more and 0.6 wavelength or less at a frequency corresponding to the bit rate of the digital modulation signal. Here, the bit rate is 25.78 Gbit/s, and the frequency corresponding to the bit rate is 25.78 GHz. That is, the frequency corresponding to the bit rate of the digital modulation signal is obtained by changing the unit to Hz with the numerical value of the bit rate (unit bit/s) unchanged.

It is desirable that the first resonator conductor 104 has a shape that is substantially line symmetrical with respect to the pair of strip conductors 101 and 102 in a plan view. Here, the description of "to be line symmetrical with respect to the pair of strip conductors 101 and 102" means to be line symmetrical with respect to the center line of the pair of strip conductors 101 and 102 (center line of the strip conductor 101 and center line of the strip conductor 102). It is desirable to reduce the influence on the conduction propagation of the differential signal component transmitted to the differential transmission line. Therefore, it is desirable that the resonator structure is symmetrical with respect to the pair of strip conductors 101 and 102.

Figure 4:
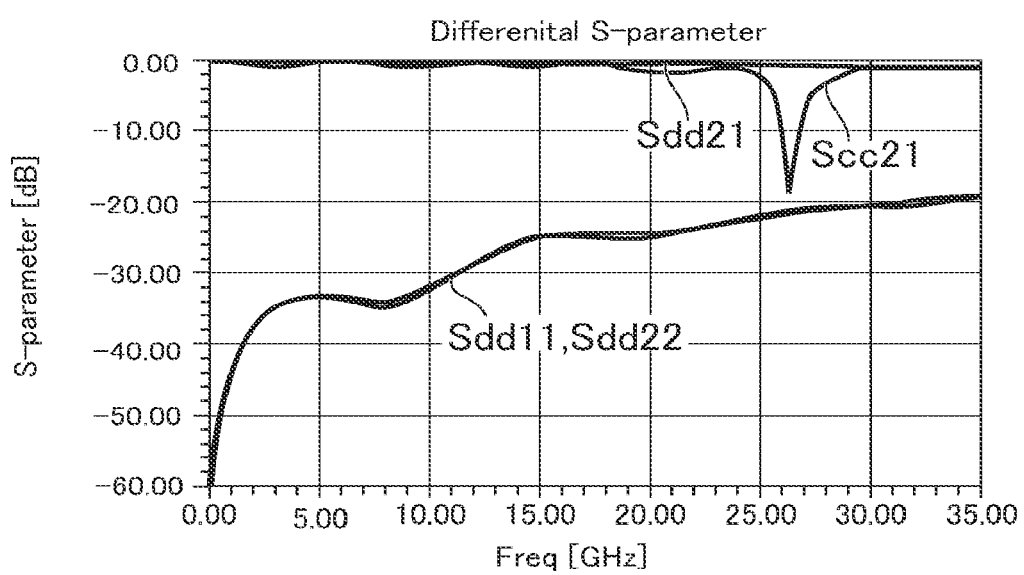
FIG. 4 is a diagram illustrating characteristics of a differential transmission line according to the first embodiment of the present invention.

FIG. 4 is a diagram illustrating characteristics of a differential transmission line 32 according to the first embodiment. FIG. 4 is a graph illustrating the frequency dependence of the differential mode pass characteristic (Sdd21), differential mode reflection characteristic (Sdd11 and Sdd22), and common mode pass characteristic (Scc21) in the differential transmission line 32. Since the first resonator conductor 104 (first resonator structure) three-dimensionally intersects with the pair of strip conductors 101 and 102 (differential transmission line 32), deterioration (increase) occurs in the differential mode reflection characteristic (Sdd 11 and Sdd 22), but it is a value of −20 dB or less in the frequency range of 0 to 30 GHz, and a relatively favorable value is maintained. This is considered to be due to the fact that the first resonator conductor 104 has a narrow linear shape with a width $W_1$ of 0.20 mm, and the area which three-dimensionally intersects with the pair of strip conductors 101 and 102 (facing area, and overlapping area in a plan view) is reduced.

In addition, the differential mode pass characteristic (Sdd 21) illustrates favorable characteristics. On the other hand, in the common mode pass characteristic (Scc 21), an attenuation region centered at the frequency 26.3 GHz is generated, and conduction propagation of the common mode signal component of the frequency 25.78 GHz can be inhibited by approximately 10 dB.

Figure 12:
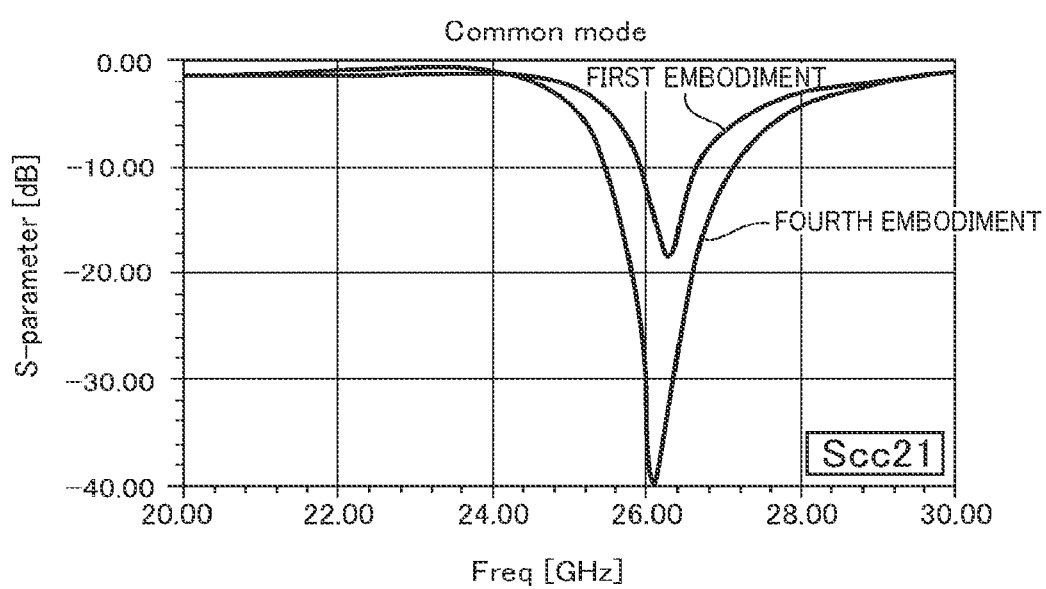
FIG. 12 is a diagram illustrating characteristics of a differential transmission line according to the third embodiment of the present invention.
Figure 18:
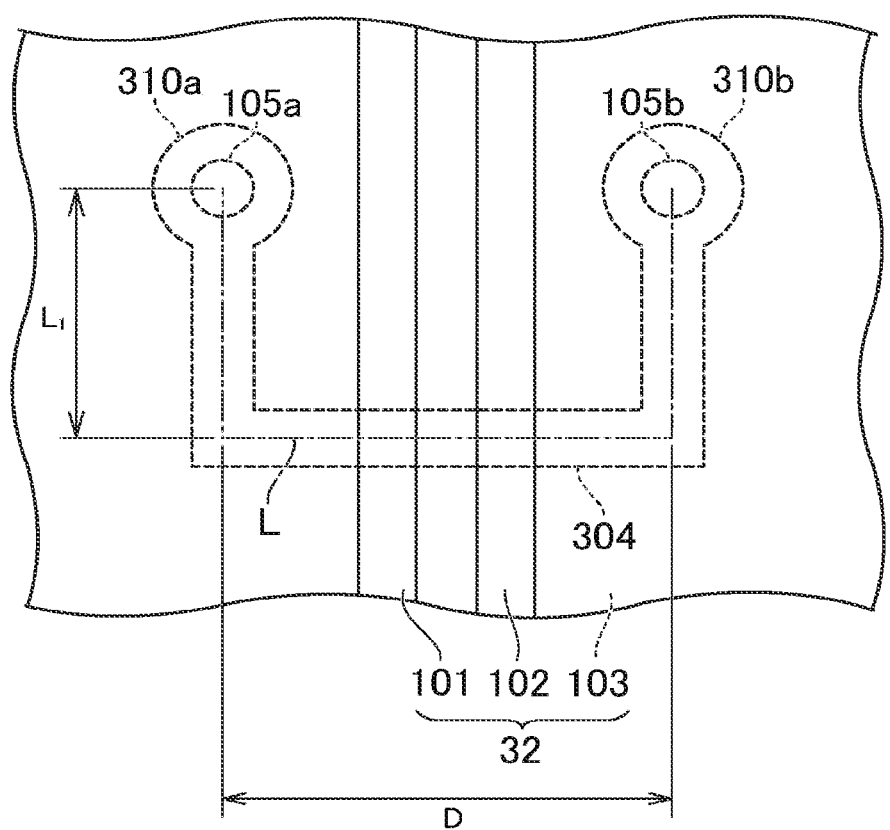
FIG. 18 is a schematic view illustrating a flat surface of a portion of a print circuit board according to a comparative example of the first embodiment of the present invention.
Figure 19:
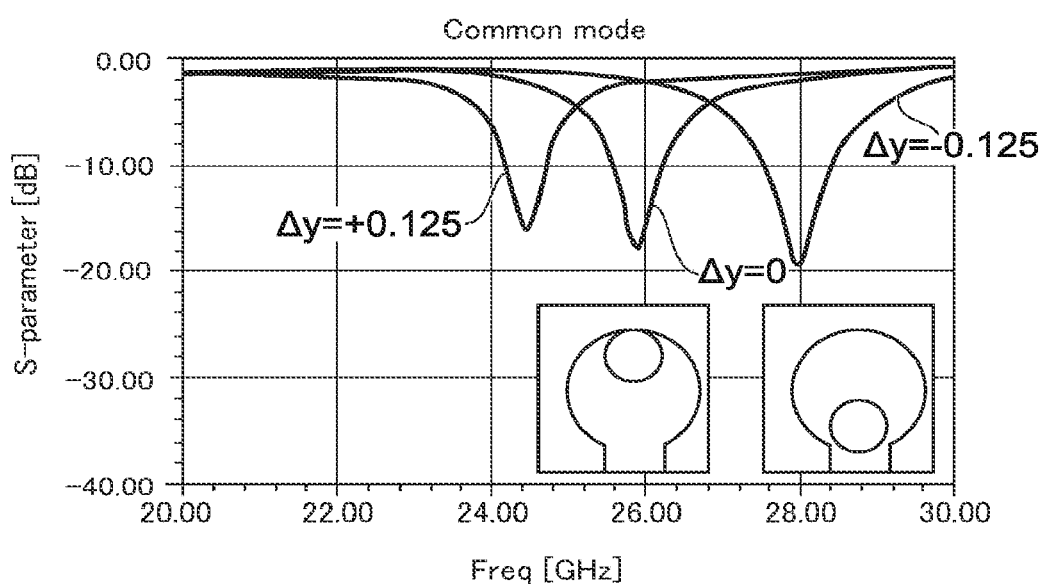
FIG. 19 is a diagram illustrating characteristics of a differential transmission line according to the comparative example of the first embodiment of the present invention.

FIG. 18 is a schematic view illustrating a flat surface of a portion of a print circuit board 331 according to a comparative example of the first embodiment. FIG. 19 is a diagram illustrating characteristics of a differential transmission line 32 according to the comparative example, and illustrates the common mode pass characteristic (Scc 21) in a case where the positional deviation Δy is +0.125 mm, 0, and −0.125 mm, respectively. The print circuit board 331 according to the comparative example has the same structure except that the shape of the first resonator conductor 304 is different from the shape of the first resonator conductor 104 according to the first embodiment. The first resonator conductor 304 according to the comparative example extends along any one direction in the first orientation (downward as illustrated in FIG. 12) from land portions 310a and 310b disposed at the both ends, extends to the inside of the first resonator conductor 304 along the second orientation, and reaches the portion that three-dimensionally intersects with the pair of strip conductors 101 and 102. The distance D between the centers of the pair of first via holes 105a and 105b is 1.4 mm, and the line length L of the first resonator conductor 304 from the center position of the via hole 105a to the center position of the via hole 105b is 3.2 mm. Since the first resonator conductor 304 has such a shape, in a case where the center positions of the pair of first via holes 105a and 105b are disposed at the center positions of the land portions 310a and 310b, respectively, the characteristics of a differential transmission line 332 are similar to the characteristics of the differential transmission line 32 illustrated in FIG. 4.

Next, the influence of characteristics due to the positional deviation of the pair of first via holes 105a and 105b with respect to the first resonator conductor 104 (or 304) between the differential transmission line 32 according to the first embodiment and the differential transmission line 32 according to the comparative example will be examined. As described above, the pair of first via holes 105a and 105b having the positional deviation amount of 0.125 mm may vary by ±0.125 mm maximum with respect to the first resonator conductor 104 (or 304) in each of the first orientation and the second orientation. As described above, since the first resonator conductor 104 (or 304) and the pair of first via holes 105a and 105b are formed in separate steps, respectively, the relative position between the first resonator conductor 104 (or 304) and the pair of first via holes 105a and 105b varies. However, since the planar shape of the first resonator conductor 104 is formed by patterning, the relative positional variations of the land portions 110a and 110b (or 310a and 310b) of the first resonator conductor 104 (or 304) are significantly small. Similarly, since the pair of first via holes 105a and 105b are formed by a common drilling step, the relative positional variations (distance D between the centers) of the pair of first via holes 105a and 105b are significantly small.

First, regarding the comparative example, the positional deviation Δy of the pair of first via holes 105a and 105b (each center position) with respect to the land portions 310a and 310b (each center position) along the first orientation (vertical orientation illustrated in FIG. 18) will be considered. The positional deviation Δy=0 is a case where the center position of each of the pair of first via holes 105a and 105b coincides with the center position of each of the land portions 310a and 310b. The positional deviation Δy=+0.125 mm is a case where the center position of each of the pair of first via holes 105a and 105b is deviated upward as illustrated in FIG. 18 from the center position of each of the land portions 310a and 310b. The positional deviation Δy=−0.125 mm is a case where the center position of each of the pair of first via holes 105a and 105b is deviated downward as illustrated in FIG. 18 from the center position of each of the land portions 310a and 310b. In the first resonator conductor 304 depending on the comparative example, the line length L varies according to the positional deviation Δy along the first orientation. The line length L when positional deviation Δy=+0.125 mm is 0.25 mm longer than the line length L when Δy=0, the line length L when Δy=−0.125 mm is 0.25 mm shorter than the line length L when Δy=0, and the line length L of the first resonator conductor 304 significantly varies depending on the positional deviation Δy. That is, the differential transmission line 332 according to the comparative example is significantly affected by the positional deviation along the first orientation between the first resonator conductor 304 and the pair of first via holes 105a and 105b. As illustrated in FIG. 19, the center frequency of the attenuation region in the common mode pass characteristic (Scc 21) significantly varies up and down to 3.6 GHz. Therefore, in the differential transmission line 332 according to the comparative example 1, it is found that it is difficult to inhibit the conduction propagation of the common mode signal component of the frequency (25.78 GHz) corresponding to the bit rate of the digital modulation signal by the first resonator structure due to the manufacturing variation.

On the other hand, the first resonator conductor 104 according to the first embodiment extends in a linear shape to the inside of the first resonator conductor 104 along the second orientation from each of (centers of) the land portions 110a and 110b at both ends. Therefore, in the pair of first via holes 105a and 105b (each of the center positions), even in a case where the positional deviation Δy with respect to the land portions 110a and 110b (each of the center positions) along the first orientation (vertical orientation illustrated in FIG. 2) occurs, the variation of the line length L of the first resonator conductor 104 according to the first embodiment is suppressed. Therefore, the variation of the center frequency of the attenuation region in the common mode pass characteristic (Scc 21) of the differential transmission line 32 according to the first embodiment due to the positional deviation Δy is significantly small compared to the variation of the differential transmission line 332 according to the comparative example.

Secondly, a case where the positional deviation Δx with respect to the land portions 110a and 110b (each of the center positions) occurs in the pair of first via holes 105a and 105b (each of the center positions) along the second orientation (horizontal orientation illustrated in FIG. 2) will be considered. The variation of the line length L of the first resonator conductor 104 according to the first embodiment is significantly small even in a case where the positional deviation occurs in any direction in the second orientation. In a case where the position of the via hole 105a is deviated with respect to the land portion 110a, for example, to the right as illustrated in FIG. 2, the length of the center line along the first orientation on the side of the via hole 105a decreases depending on the positional deviation amount, but the length of the center line along the first orientation on the side of the via hole 105b increases depending on the positional deviation amount, and the variation of the line length L is significantly small. Therefore, the variation of the center frequency of the attenuation region in the common mode pass characteristic (Scc 21) of the differential transmission line 32 according to the first embodiment is significantly small. In a case where the positional deviation Δy with respect to the first resonator conductor 304 occurs in the pair of first via holes 105a and 105b according to the comparative example along the second orientation (horizontal orientation illustrated in FIG. 18), the variation of the line length L of the first resonator conductor 304 according to the comparative example is small, similar to the positional deviation Δx along the first orientation of the first resonator conductor 104 according to the first embodiment.

In the differential transmission line 32 according to the first embodiment, it is possible to selectively inhibit the conduction propagation of the common mode signal component to the differential transmission line 32 while suppressing deterioration of the conduction propagation of the differential signal component. That is, substantially, only the conduction propagation of the common mode signal component to the differential transmission line can be selectively inhibited. In addition, in the formation of the first resonator conductor 104 and the pair of first via holes 105a and 105b according to the first embodiment, an additional step is not required, and an increase in manufacturing cost is suppressed. Furthermore, since the shape of the first resonator conductor 104 according to the first embodiment is bent, the region where the first resonator conductor 104 is disposed can be reduced, and the first resonator conductor 104 can be disposed at a high density.

Although the dielectric layer 100 according to the first embodiment is formed using a material including a glass cloth substrate and an epoxy resin (glass epoxy resin), it is not limited to this material, and may be a liquid crystal polymer (LCP) or a fluorine-based resin (Polytetrafluoroethylene: PTFE).

In the optical module (optical transceiver and optical transceiver module) for optical fiber transmission, speeding up, downsizing, and cost reduction is achieved, with the spread of broadband network in recent years, and regarding speeding up, currently the optical module having a bit rate of 100 Gbit/s are widely used. Regarding downsizing and cost reduction, the housing (case) volume is reduced and the number of parts is reduced from the CFP Multi Source Agreement (MSA) standard to CFP 2, CFP 4, and QSFP 28 (each MSA standard).

In addition, in the optical transmission equipment (network equipment) on which the optical module is mounted, it is required to suppress the intensity of unnecessary electromagnetic waves generated by the equipment to a limit value defined by law or regulations. For example, in the United States, it is required to reduce the intensity of unnecessary electromagnetic waves below the limit value of 53.9 dB (μV/m) specified in "FCC Part 15 Subpart B" standard (in a case where distance is 3 m, and frequency range is 1 GHz to 40 GHz in Class B standard). In the optical module, unnecessary electromagnetic waves at high frequency are generated in many cases due to switching noises or the like of built-in IC. Therefore, a design technique for reducing radiation of the unnecessary electromagnetic waves to the outside of the equipment is important in both the optical transmission equipment and the optical module.

In the optical module, the main excitation source of unnecessary electromagnetic waves is an IC (such as CDR, Driver, TIA, and the like) that amplifies and outputs an electrical serial data signal (modulation signal). Unlike the clock signal, the ideal serial data signal does not include repetitive signal patterns, so that it does not have a large peak intensity on the frequency spectrum. However, in a differential amplifier circuit inside the actual IC, switching noise is generated due to nonlinearity of the transistor. Therefore, in a case of observing the frequency spectrum of the common mode component of the output signal, a large peak occurs at the frequency corresponding to the bit rate. While conducting and propagating through the differential transmission line on the print circuit board, the common mode signal component propagates to space as apart thereof as radiation loss. As a result, since an electric serial data signal having a bit rate of 25.78 Gbit/s is used in the optical module of 4 channels on both the transmitting side and the receiving side at a bit rate of 100 Gbit/s, unnecessary electromagnetic waves having a frequency of 25.78 GHz corresponding to the bit rate are generated. In the optical module in the related art, the gap between the metal housing (metal casing) in the outer shell is further reduced, so that the space propagation of electromagnetic waves is further shielded. Furthermore, a radio wave absorbing material is disposed inside the metal housing, so that the space propagation of electromagnetic waves is attenuated to suppress leakage of unnecessary electromagnetic waves from the optical transceiver.

In recent years, as the capacity of the optical transmission equipment is increased, LSI (FPGA) having large power consumption (heat generation amount) is mounted on the optical transmission equipment. In the optical transmission equipment, a large number of ventilation holes are disposed to strengthen air blowing cooling, and the shielding effect of the equipment tends to be low. In addition, a plurality of optical modules of 100 Gbit/s class are mounted on the optical transmission equipment. In the optical module conforming to the main MSA standard, for example, QSFP 28, an external connection terminal is disposed on one end of the print circuit board, and the external connection terminal is connected to a connector mounted on the optical transmission equipment outside the metal housing. According to this configuration, there is a problem that unnecessary electromagnetic waves radiated from the differential transmission line and the connector drawn to the outside of the metal housing are the main cause, and unnecessary electromagnetic waves of the optical transmission equipment cannot be sufficiently suppressed.

In the optical module conforming to the QSFP 28, on a small print circuit board having a board width of approximately 16 mm, it is required to dispose four pairs of differential transmission lines for the transmitting circuit and four pairs of differential transmission lines for the receiver circuit, respectively. The inventors have found that the size (length and width) of the resonator structure in the related art requires a relatively large area to obtain a desired resonance frequency, and it is difficult to dispose the resonator structure in the related art on the print circuit board of the optical module conforming to the QSFP 28. On the other hand, the print circuit board 31 according to the first embodiment has a structure suitable for solving such a problem.

Figure 5:
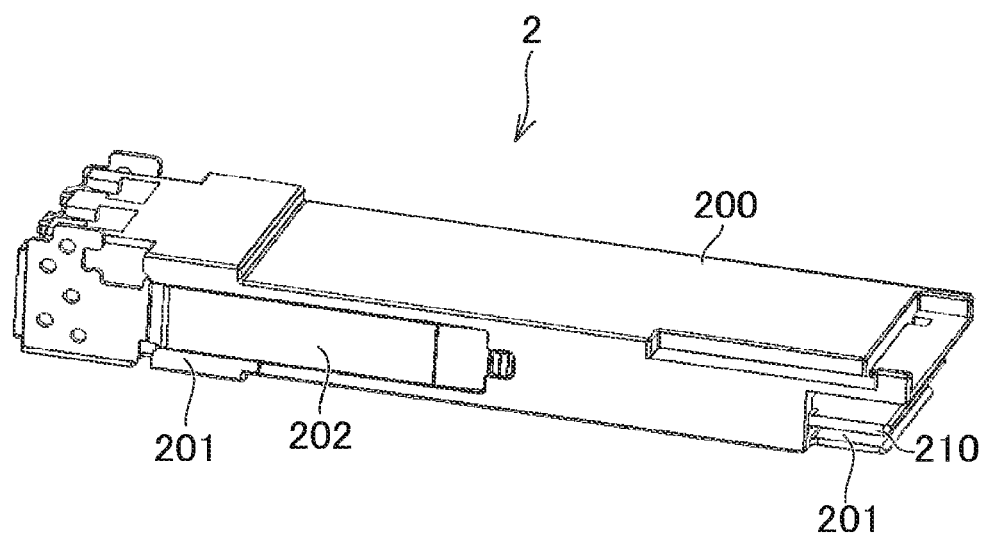
FIG. 5 is a schematic perspective view illustrating an external shape of an optical module according to the first embodiment of the present invention.
Figure 6:
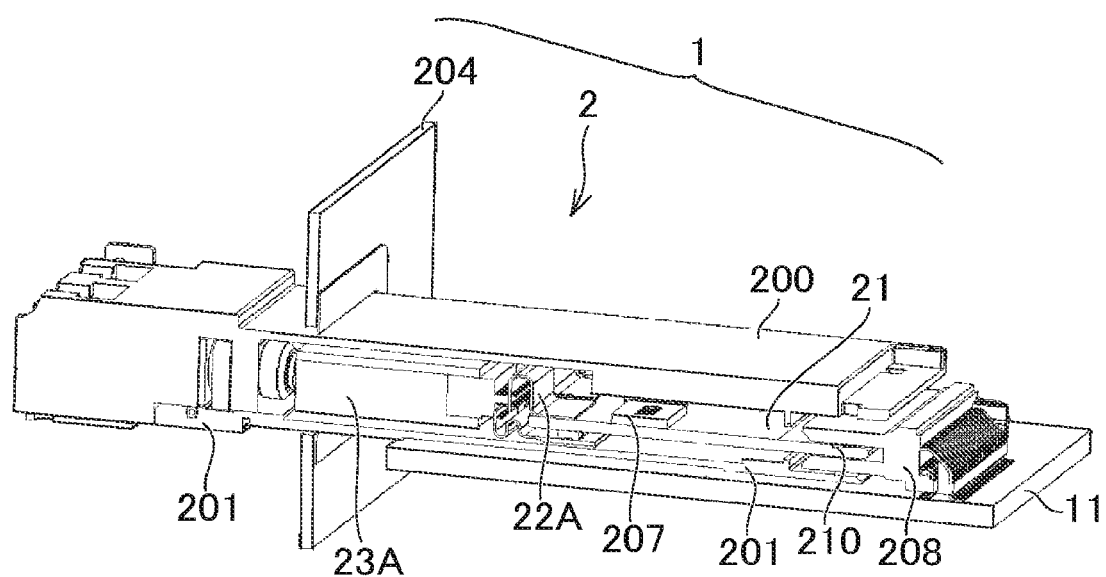
FIG. 6 is a schematic perspective view illustrating the structure of the optical module according to the first embodiment of the present invention.

FIG. 5 is a schematic perspective view illustrating an external shape of an optical module 2 according to the first embodiment. FIG. 6 is a schematic perspective view illustrating the structure of the optical module 2 according to the first embodiment. FIG. 6 illustrates a state where the optical module 2 is mounted on the optical transmission equipment 1. The print circuit board 31 according to the first embodiment is the print circuit board 21 here.

The optical module 2 according to the first embodiment is the optical module conforming to the QSFP (MSA standard). As illustrated in FIG. 5, the optical module 2 includes an upper case 200, a lower case 201, a latch 202, and a card edge connector 210. Metal such as zinc or aluminum is used as the material of the upper case 200 and the lower case 201, and a metal housing is configured to include the upper case 200 and the lower case 201. The upper case 200 and the lower case 201 configure an electromagnetic shield by covering the print circuit board 21 in close contact with each other so that there are no gaps in a portion other than the opening portion for passing the card edge connector 210. That is, the metal housing (upper case 200 and lower case 201) functions as an electromagnetic shield against the radiation from the print circuit board 21 inside the metal housing. Although the metal housing has the opening portion, the metal housing functions sufficiently as the electromagnetic shield. On the other hand, the metal housing has no function of preventing conduction propagation of unnecessary noise components contained in the output signal from the optical module to the optical transmission equipment. As a result, unnecessary electromagnetic waves caused by unnecessary noise components conducted and propagated to the differential transmission line drawn out to outside of the metal housing through the opening portion and the connector portion can be radiated to outside of the metal housing. The card edge connector 210 is an end portion of the print circuit board 21, and a plurality of contact terminals for connecting the connector are disposed in a row. The card edge connector 210 is exposed to the outside from the opening portion (slot opening portion) on the rear sides (right side in FIG. 5) of the upper case 200 and the lower case 201, and has the function of hot swapping. The opening portion is provided to expose a portion of the print circuit board 21 to the outside.

FIG. 6 illustrates a state where the optical module 2 is mounted on the optical transmission equipment 1, and in order to illustrate the internal structure of the optical module 2, a portion of the upper case 200 and the lower case 201 is not illustrated. In FIG. 6, a portion of the print circuit board 11 and a front panel 204 inside the optical transmission equipment 1 are illustrated. Furthermore, a print circuit board 11 further includes the connector 208 conforming to the QSFP 28 (MSA standard), and the connector 208 is mounted on the print circuit board 11. ROSA 23A (receiver optical subassembly), TOSA 23B (transmitter optical subassembly: not illustrated), and flexible boards 22A and 22B (22B not illustrated) are mounted inside of the upper case 200 and the lower case 201 of the optical module 2. The print circuit board 21 includes a plurality of ICs. For example, a Clock Data Recovery IC (CDR-IC) 207 on the receiving side is mounted on the print circuit board 21, and the CDR-IC 207 outputs the 4-channel differential digital modulation signal at a bit rate of 25.78 Gbit/s. The output signal is conducted and propagated to the print circuit board 11 inside the optical transmission equipment 1 through the four pairs of differential transmission lines 32 (not illustrated) disposed on the print circuit board 21, the card edge connector 210, and the connector 208. The first resonator structure illustrated in FIG. 2 is disposed in each of the four pairs of differential transmission lines 32 disposed on the print circuit board 21.

When measuring the output spectrum of the CDR-IC 207, originally unnecessary clock noise components are observed as a peak of peak single at a frequency of 25.78 GHz corresponding to the bit rate. However, the first resonator structure illustrated in FIG. 2 is disposed in each of the four pairs of differential transmission lines 32, so that the conduction propagation of the common mode signal component at the frequency of 25.78 GHz can be inhibited inside the upper case 200 and the lower case 201 of the optical module 2. Therefore, in the card edge connector 210, the connector 208, and the print circuit board 11 of the optical transmission equipment 1, radiation of unnecessary electromagnetic waves caused by the common mode signal component can be reduced. Similarly to this mechanism, the first resonator structure illustrated in FIG. 2 is disposed on the differential transmission line disposed on the print circuit board 11 of the optical transmission equipment 1. Therefore, it is possible to reduce radiation of unnecessary electromagnetic waves to the outside of the optical transmission equipment 1 through radiation of unnecessary electromagnetic waves into the inside of the optical transmission equipment 1 and vent holes for cooling air blowing of the optical transmission equipment 1 and the like.

In the print circuit board 21 illustrated in FIGS. 5 and 6, the CDR-IC 207 for receiving is disposed on the print circuit board 21, but it is not limited thereto, and may be mounted in the inside of the ROSA 23A. In this case, since it is not required to dispose the CDR-IC 207 on the print circuit board 21, the area for disposing the first resonator conductor 104 illustrated in FIG. 2 on the print circuit board 21 can be widely allocated to each of the four pairs of differential transmission lines, and the degree of freedom of circuit design of the print circuit board 21 is improved.

Second Embodiment

Figure 7:
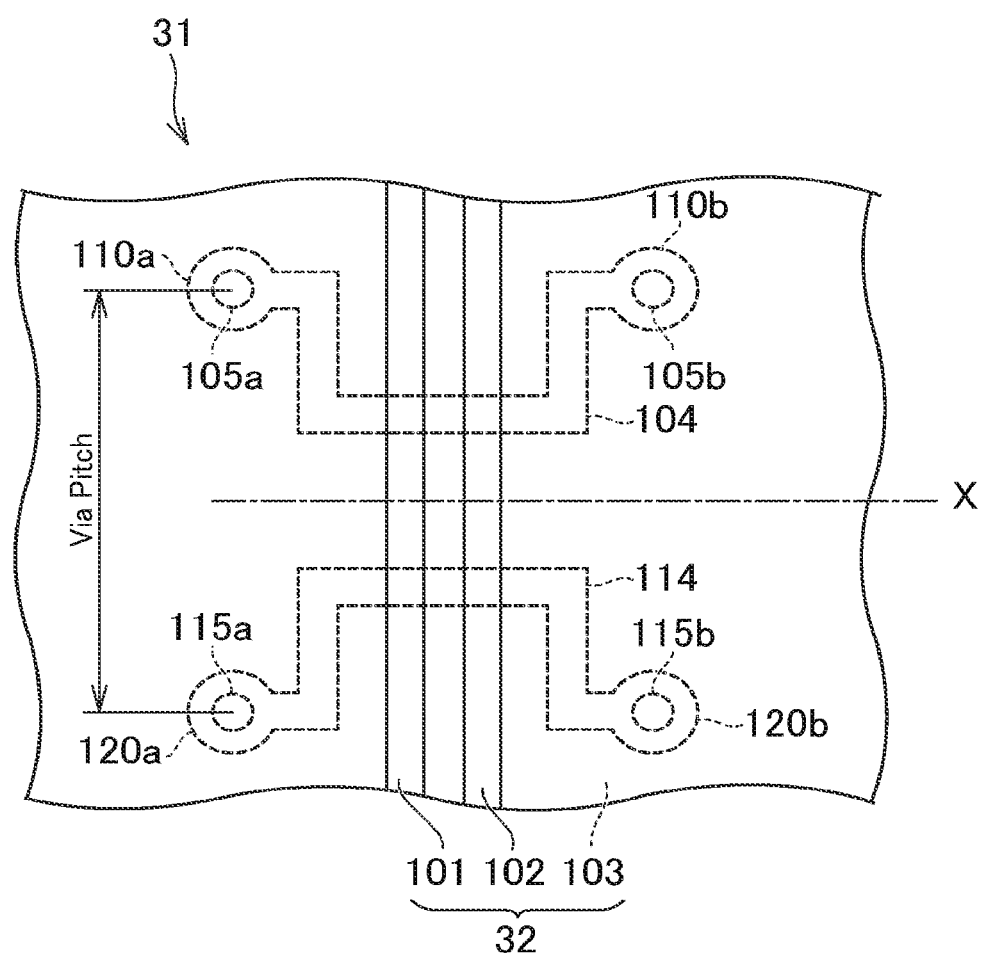
FIG. 7 is a schematic view illustrating a flat surface of a portion of a print circuit board according to a second embodiment of the present invention.
Figure 8:
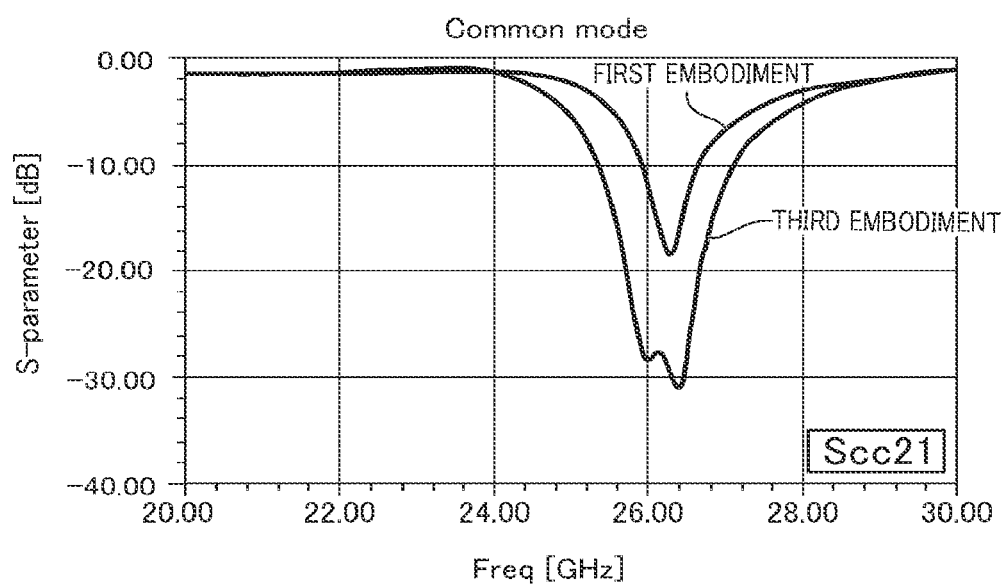
FIG. 8 is a diagram illustrating characteristics of a differential transmission line according to the second embodiment of the present invention.

FIG. 7 is a schematic view illustrating a flat surface of a portion of a print circuit board 3l according to a second embodiment of the present invention. FIG. 8 is a diagram illustrating characteristics of a differential transmission line 32 according to the second embodiment. FIG. 8 illustrates the common mode pass characteristic (Scc 21) of the differential transmission line 32 according to the second embodiment, and the common mode pass characteristic (Scc 21) of the differential transmission line 32 according to the first embodiment of the present invention for comparison. Although the print circuit board 31 according to the second embodiment is different from the first embodiment in that the print circuit board 31 further includes a second resonator conductor 114 and second via holes 115a and 115b in addition to the first resonator conductor 104, the other structure is the same as that of the first embodiment.

The second resonator conductor 114 is disposed in the same layer (second metal layer) as the first resonator conductor 104, and is provided with circular land portions 120a and 120b at both ends thereof. The second resonator conductor 114 is disposed side by side with the first resonator conductor 104 along the first orientation (vertical orientation in FIG. 7), and the planar shape of the second resonator conductor 114 is substantially line symmetric with the plane shape of the first resonator conductor 104 with respect to the straight line X illustrated in FIG. 7. The second resonator conductor 114 extends to the outside along the second orientation in parallel with the first resonator conductor 104 from the portions three-dimensionally intersecting with the pair of strip conductors 101 and 102, bends in the other direction in the first orientation (downward in FIG. 2), further extends away from the first resonator conductor 104 along the first orientation, bends to the outside in the second orientation, and extends to the outside along the second orientation to connect the pair of second via holes 115a and 115b. Similarly to the first resonator conductor 104, the pair of second via holes 115a and 115b (circular shape) are respectively disposed so that the center of the circular shape is ideally penetrated through the center of the circular shape of the land portions 120a and 120b. The pair of second via holes 115a and 115b connects (land portions 120a and 120b at the both ends of) the second resonator conductor 114 and the ground conductor layer 103, respectively. The second resonator structure is configured to include the ground conductor layer 103, the second resonator conductor 114, and the pair of second via holes 115a and 115b.

Here, in the print circuit board 32 according to the second embodiment, the distance between the centers (Via Pitch) between one first via hole (via hole 105a) of the pair of first via holes and one second via hole (via hole 115a) of the pair of second via holes disposed along the first orientation is changed. Therefore, the attenuation characteristic in the common mode pass characteristic can be adjusted. Here, the distance between the centers (Via Pitch) is set to 2.2 mm. However, the distance is not limited to this value, and the distance may be set to an appropriate value according to the attenuation characteristic in the common mode pass characteristic.

Since the first resonator conductor 104 and the second resonator conductor 114 are disposed on the print circuit board 32 according to the second embodiment, a wider region is required for disposing two resonator conductors. However, as illustrated in FIG. 8, in the common mode pass characteristic (Scc 21) of the differential transmission line 32 according to the second embodiment, the attenuation region centered at a frequency of 26.3 GHz is generated, and conduction propagation of the common mode signal component of the frequency of 25.78 GHz can be inhibited by approximately 20 dB. Compared to the common mode pass characteristic (Scc 21) of the differential transmission line 32 according to the first embodiment of the present invention, the common mode pass characteristic (Scc 21) according to the second embodiment achieves greater attenuation, and the frequency range that can inhibit the conduction propagation of the common mode signal component can be widened.

Figure 9:
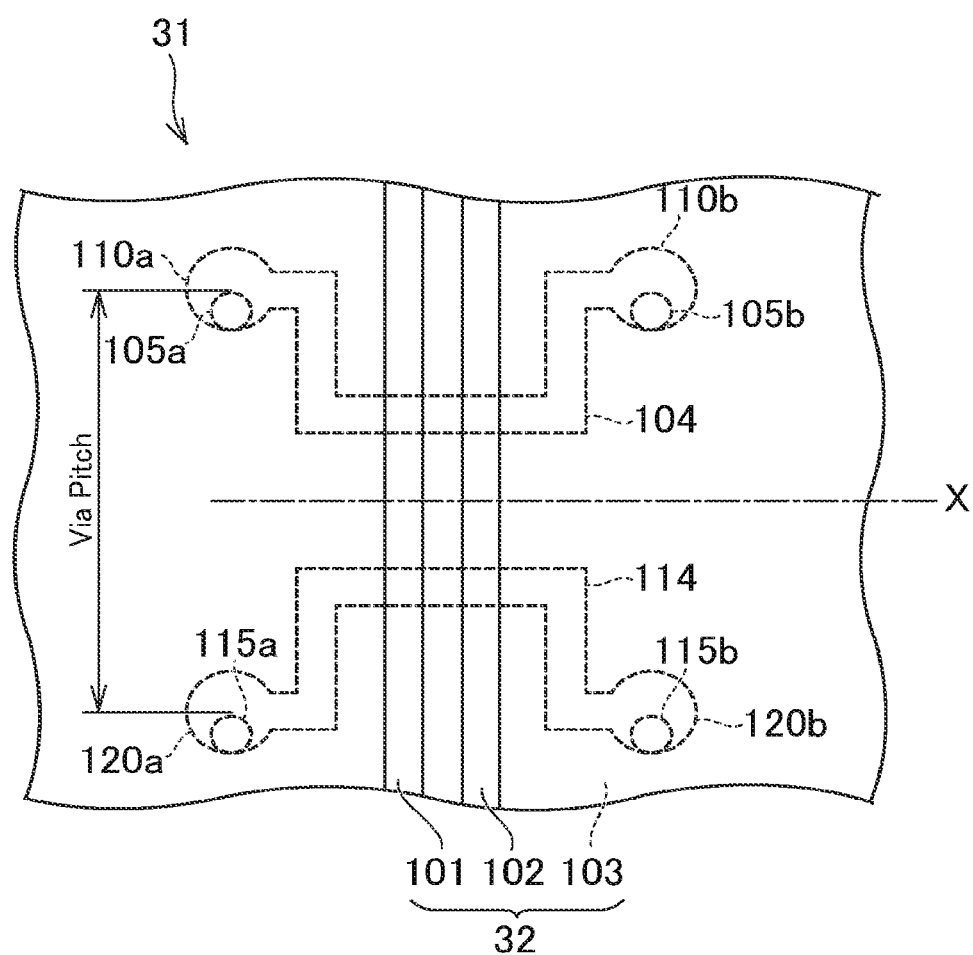
FIG. 9 is a schematic view illustrating the flat surface of the portion of the print circuit board according to the second embodiment of the present invention.
Figure 10:
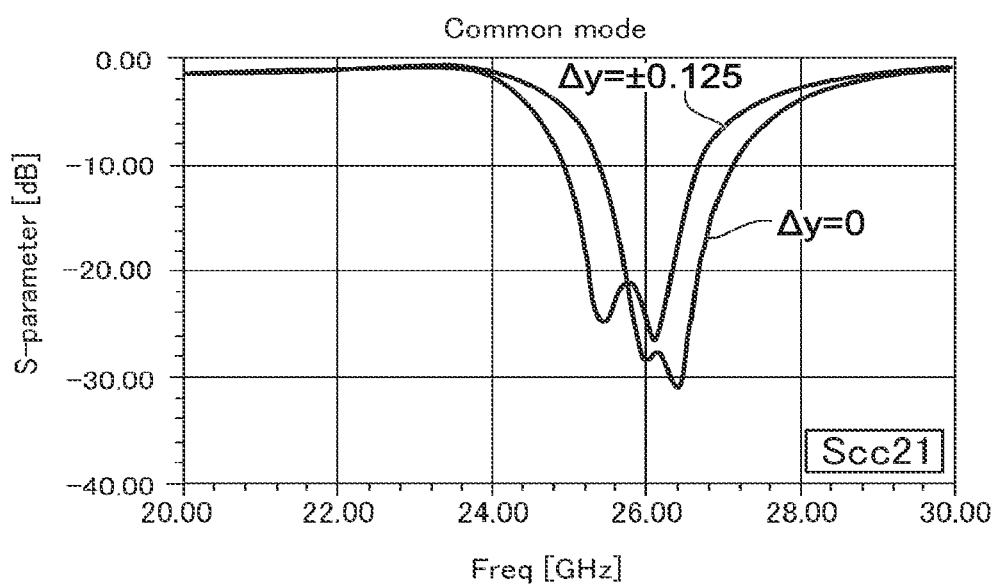
FIG. 10 is a diagram illustrating characteristics of the differential transmission line according to the second embodiment of the present invention.

FIG. 9 is a schematic view illustrating the flat surface of the portion of the print circuit board 31 according to the second embodiment of the present invention. FIG. 10 is a diagram illustrating characteristics of the differential transmission line 32 according to the second embodiment. FIG. 9 illustrates a case where the positional deviation Δy occurs with respect to the land portions 110a and 110b and the land portions 120a and 120b in any one direction of the first orientation (downward as illustrated in FIG. 9) in the pair of first via holes 105a and 105b and the pair of second via holes 115a and 115b in the print circuit board 31 illustrated in FIG. 7. Here, the positional deviation Δy is −0.125 mm. FIG. 10 illustrates the common mode pass characteristic (Scc 21) of the differential transmission line 32 (Δy=0) illustrated in FIG. 9, and the common mode pass characteristic (Scc 21) of the differential transmission line 32 (Δy=±0.125 mm) illustrated in FIG. 7 for comparison. Since the planar shape of the first resonator conductor 104 and the planar shape of the second resonator conductor 114 are line symmetric with respect to the straight line X, even if any positional deviation in any one direction of the first orientation (upward or downward in FIG. 9) occurs, if the absolute values are the same, the obtained common mode passing characteristic (Scc 21) is substantially the same. As illustrated in FIG. 10, even in a case where the positional deviation Δy occurs (Δy=±0.125 mm), although the center frequency of the attenuation region in the common mode pass characteristic (Scc 21) varies to a frequency lower by approximately 0.5 GHz, the conduction propagation of the common mode signal component can be inhibited by approximately 20 dB at the frequency of 25.78 GHz.

Third Embodiment

Figure 11:
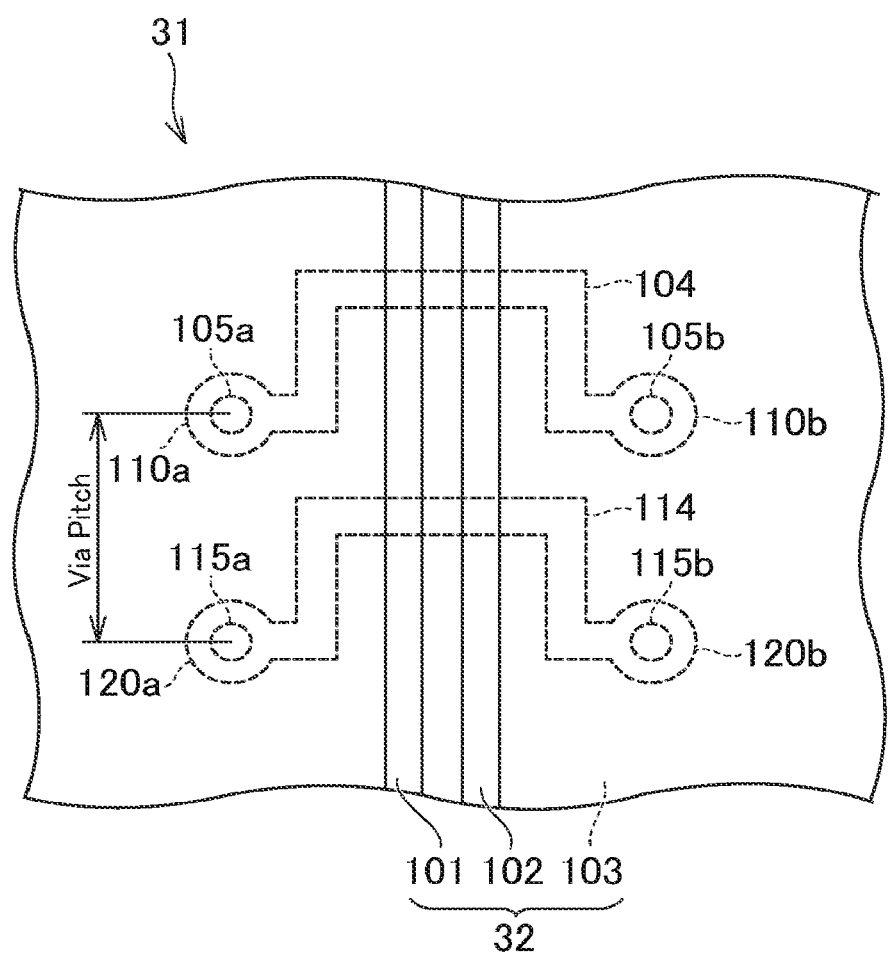
FIG. 11 is a schematic view illustrating a flat surface of a portion of a print circuit board according to a third embodiment of the present invention.

FIG. 11 is a schematic view illustrating a flat surface of a portion of a print circuit board 31 according to a third embodiment of the present invention. FIG. 12 is a diagram illustrating characteristics of a differential transmission line 32 according to the third embodiment. FIG. 12 illustrates the common mode pass characteristic (Scc 21) of the differential transmission line 32 according to the third embodiment, and the common mode pass characteristic (Scc 21) of the differential transmission line 32 according to the first embodiment of the present invention for comparison. Although in the print circuit board 31 according to the third embodiment, the shape of the second resonator conductor 114 is different from that of the second embodiment, the other structure is the same as that of the second embodiment.

In the second embodiment, the planar shape of the second resonator conductor 114 is substantially line symmetric with the plane shape of the first resonator conductor 104 with respect to the straight line X illustrated in FIG. 7, whereas in the third embodiment, the planar shape of the second resonator conductor 114 substantially coincides with the one obtained by translating the planar shape of the first resonator conductor 104 in any one direction of the first orientation (downward in FIG. 11). The second resonator conductor 114 extends to the outside along the second orientation in parallel with the first resonator conductor 104 from the portions three-dimensionally intersecting with the pair of strip conductors 101 and 102, bends in any one direction of the first orientation (downward in FIG. 2), further extends in the same direction as the first resonator conductor 104 along the first orientation, bends to the outside in the second orientation, and extends to the outside along the second orientation to connect with the pair of second via holes. Similarly to the second embodiment, the pair of second via holes 115a and 115b (circular shape) are respectively disposed so that the center of the circular shape is ideally penetrated through the center of the circular shape of the land portions 120a and 120b. The pair of second via holes 115a and 115b connects (land portions 120a and 120b at the both ends of) the second resonator conductor 114 and the ground conductor layer 103, respectively. The second resonator structure is configured to include the ground conductor layer 103, the second resonator conductor 114, and the pair of second via holes 115a and 115b.

Similarly to the second embodiment, in the print circuit board 32 according to the third embodiment, the distance between the centers (Via Pitch) between one first via hole (via hole 105a) of the pair of first via holes and one second via hole (via hole 115a) of the pair of second via holes disposed along the first orientation is changed. Therefore, the attenuation characteristic in the common mode pass characteristic can be adjusted. Here, the distance between the centers (Via Pitch) is set to 1.2 mm. However, the distance is not limited to this value, and the distance may be set to an appropriate value according to the attenuation characteristic in the common mode pass characteristic.

Since the first resonator conductor 104 and the second resonator conductor 114 are disposed on the print circuit board 32 according to the third embodiment, a wider region is required for disposing two resonator conductors. However, as illustrated in FIG. 12, in the common mode pass characteristic (Scc 21) of the differential transmission line 32 according to the third embodiment, the attenuation region centered at a frequency of 26.3 GHz is generated, and conduction propagation of the common mode signal component of the frequency of 25.78 GHz can be inhibited by approximately 20 dB. Compared to the common mode pass characteristic (Scc 21) of the differential transmission line 32 according to the first embodiment of the present invention, the common mode pass characteristic (Scc 21) according to the third embodiment achieves greater attenuation, and the frequency range that can inhibit the conduction propagation of the common mode signal component can be widened.

Fourth Embodiment

Figure 13:
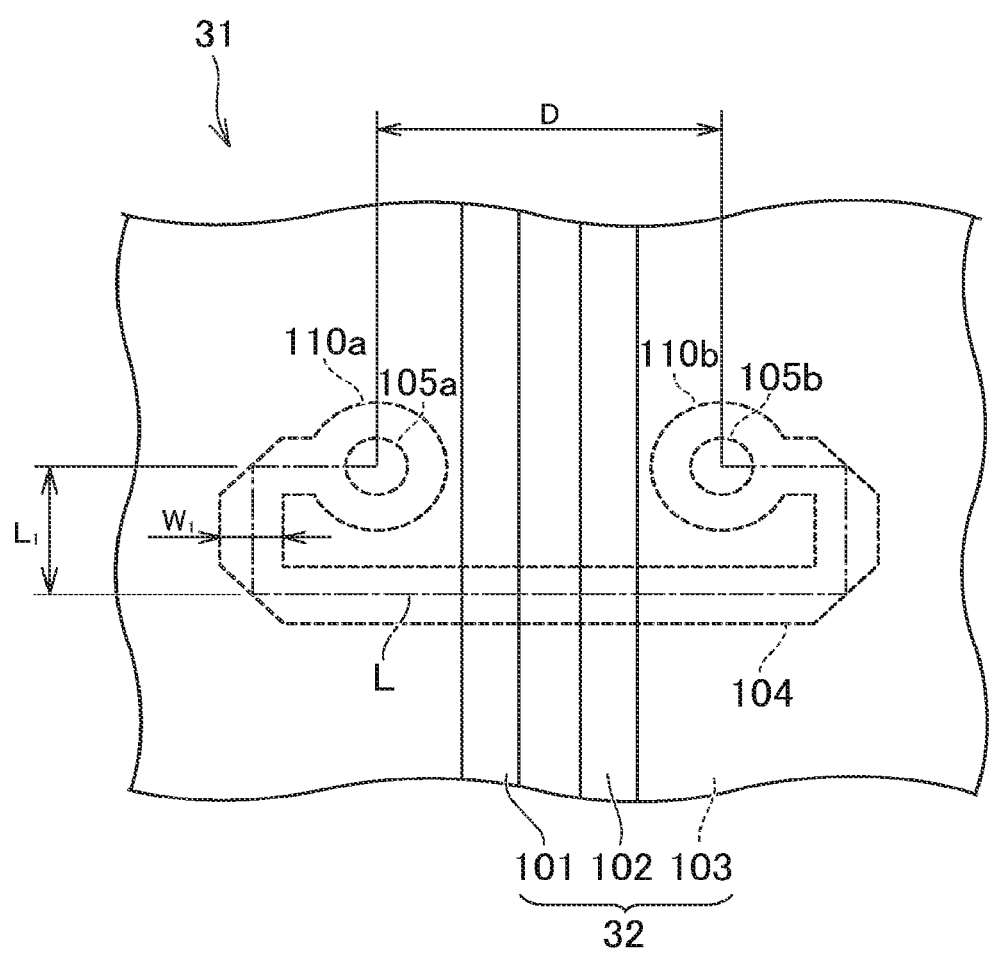
FIG. 13 is a schematic view illustrating a structure of a portion of a print circuit board according to a fourth embodiment of the present invention.

FIG. 13 is a schematic view illustrating a structure of a portion of a print circuit board 31 according to a fourth embodiment of the present invention. Although in the print circuit board 31 according to the fourth embodiment, the shape of the first resonator conductor 104 is different from that of the first embodiment, the other structure is the same as that of the first embodiment. The first resonator conductor 104 according to the first embodiment extends in a linear shape from each of (centers of) the land portions 110a and 110b at both ends along the second orientation to the inside of the first resonator conductor 104, whereas the first resonator conductor 104 according to the fourth embodiment extends in a linear shape from each of (centers of) the land portions 110a and 110b at both ends along the second orientation to the outside of the first resonator conductor 104. That is, the first resonator conductor 104 according to the fourth embodiment extends from each of (centers of) the pair of first via holes 105a and 105b along the second orientation to the outside of the first resonator conductor 104.

When the directions respectively extending from both ends of the first resonator conductor 104 extends are referred to as a first extending direction and a second extending direction, and in the first to third embodiments (and the fifth to seventh embodiments), the first extending direction and the second extending direction are opposed to each other on a straight line, and the angle between the first extending direction and the second extending direction is 180°. In the fourth embodiment, the first extending direction and the second extending direction tend to separate from each other on the straight line, and the angle between the first extending direction and the second extending direction is 180°. The first extending direction and the second extending direction may be either opposed to each other (facing inward) or separate away from each other (facing outward) along the second direction, and in either case, it is possible to reduce the variation of the line length L with respect to the positional deviation Δx along the second orientation.

It is desirable that both of the first resonator conductor 104 according to the fourth embodiment extend along the second orientation from both ends thereof (land portions 110a and 110b) or from each of the pair of first via holes 105a and 105b to the outside of the first resonator conductor 104, and that both further bend in any one direction in the first orientation (downward in FIG. 13). Furthermore, it is desirable that both extend to the inside of the first resonator conductor 104 along the second orientation, and reach the portions three-dimensionally intersecting with the pair of strip conductors 101 and 102. That is, it is desirable that the first resonator conductor 104 extends to the outside along the second orientation from the portions three-dimensionally intersecting with the pair of strip conductors 101 and 102, bends in any one direction in the first orientation (upward in FIG. 2), further extends along the first orientation, bends to the inside in the second orientation, and extends to the inside along the second orientation to connect with the pair of first via holes.

The distance D between the centers of the pair of first via holes 105a and 105b is 1.1 mm and the width $W_1$ of the first resonator conductor 104 is 0.20 mm. Although the first resonator conductor 104 has a linear shape portion to be extended and a bending portion, for impedance matching, the corner of the bending portion has a cut off shape. The length $L_1$ of the center line is 0.45 mm. Even with the print circuit board 31 according to the fourth embodiment, the same effects as those of the first embodiment is achieved.

Fifth Embodiment

Figure 14:
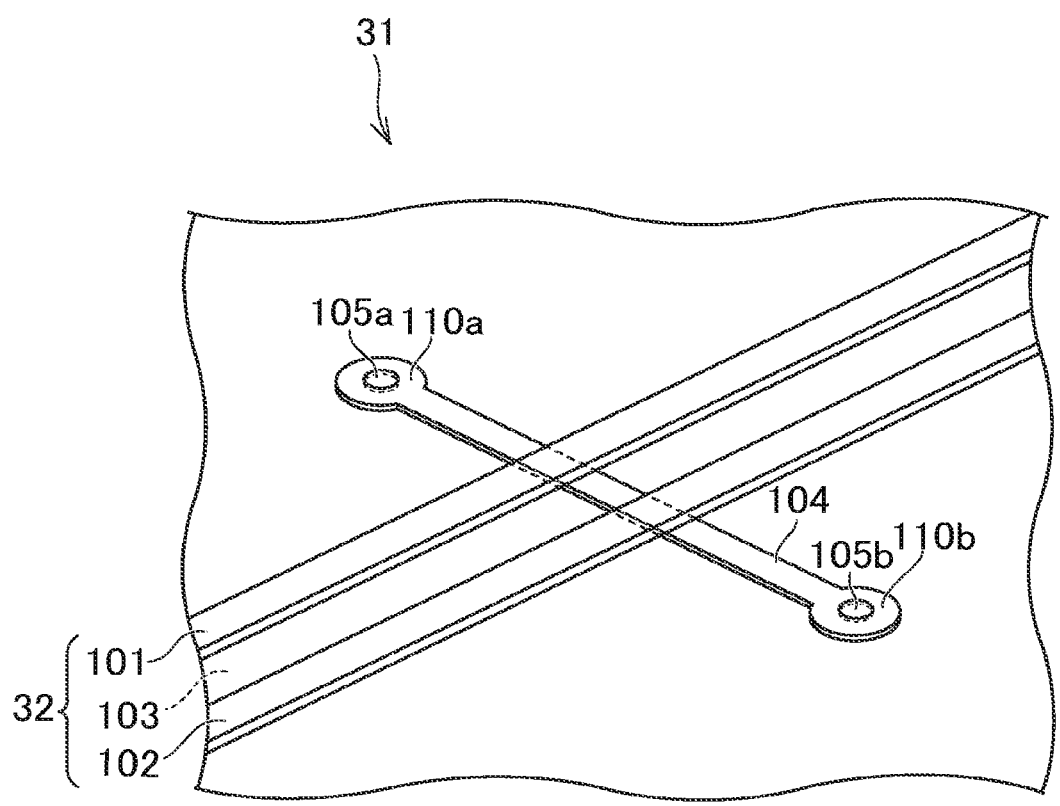
FIG. 14 is a schematic view illustrating a structure of a portion of a print circuit board according to a fifth embodiment of the present invention.

FIG. 14 is a schematic view (perspective view) illustrating a structure of a portion of a print circuit board 31 according to a fifth embodiment of the present invention. Although in the print circuit board 31 according to the fifth embodiment, the shape of the first resonator conductor 104 is different from that of the first embodiment, the other structure is the same as that of the first embodiment.

The first resonator conductor 104 according to the first embodiment has the bending portion, whereas the first resonator conductor 104 according to the fifth embodiment extends in a linear shape to the inside of the first resonator conductor 104 from both (centers of) the land portions 110a and 110h at both ends along the second orientation, and reaches the portions three-dimensionally intersecting with the pair of strip conductors 101 and 102. That is, it is desirable that the first resonator conductor 104 extends to the outside along the second orientation from the portions three-dimensionally intersecting with the pair of strip conductors 101 and 102 to connect with the pair of first via holes.

The first resonator conductor 104 according to the fifth embodiment extends in a linear shape except for the land portions 110a and 110b on both sides. The distance between the centers D between the pair of first via holes 105a and 105b is 3.05 mm. The width $W_1$ of the first resonator conductor 104 is 0.19 mm. Although the first resonator conductor 104 is formed into a linear shape, so that the distance between the centers D is longer, the resonator structure can be realized with a significantly simple configuration.

Sixth Embodiment

Figure 15:
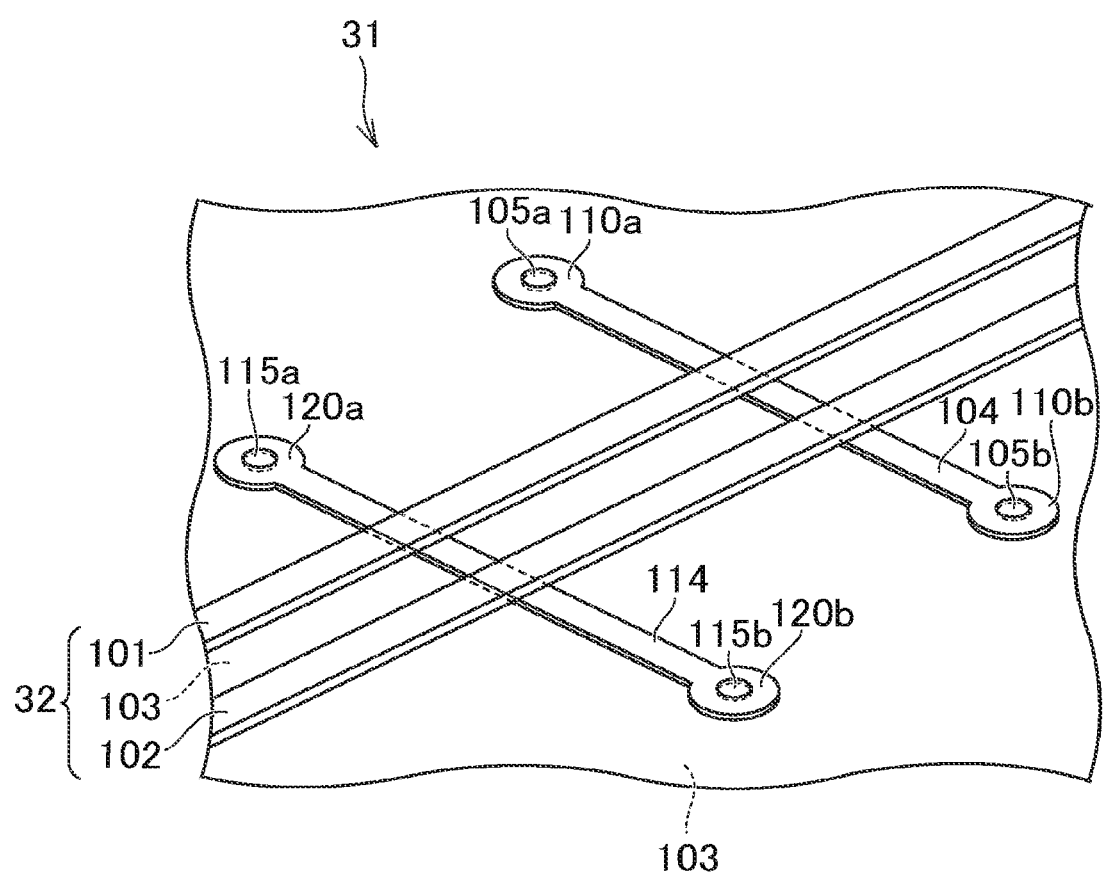
FIG. 15 is a schematic view illustrating a structure of a portion of a print circuit board according to a sixth embodiment of the present invention.

FIG. 15 is a schematic view (perspective view) illustrating a structure of a portion of a print circuit board 31 according to a sixth embodiment of the present invention. Although in the print circuit board 31 according to the sixth embodiment, the shape of the first resonator conductor 104 and the shape of the second resonator conductor 114 are different from these of the second and third embodiment, the other structure is the same as these of the second and third embodiment.

Each of the first resonator conductor 104 and the second resonator conductor 114 according to the second and third embodiments has the bending portion, whereas each of the first resonator conductor 104 and the second resonator conductor 114 according to the sixth embodiment extends in a linear shape to the inside of the first resonator conductor 104 from each of the land portions at both ends along the second orientation, and reaches the portions three-dimensionally intersecting with the pair of strip conductors 101 and 102. That is, it is desirable that the first resonator conductor 104 and the second resonator conductor 114 extend to the outside along the second orientation from the portions three-dimensionally intersecting with the pair of strip conductors 101 and 102 to connect with the pair of first via holes and the pair of second via holes.

The first resonator conductor 104 and the second resonator conductor 114 according to the sixth embodiment extend in a linear shape except for the land portions on both sides. The distance between the centers D between the pair of first via holes 105a and 105b and the distance between the centers D between the pair of second via holes 115a and 115b are both 3.05 mm. The width $W_1$ of the first resonator conductor 104 is 0.19 mm. Although the first resonator conductor 104 and the second resonator conductor 114 are formed into the linear shapes, so that the distances between the centers D are longer, the resonator structures can be realized with the significantly simple configurations.

Seventh Embodiment

Figure 16:
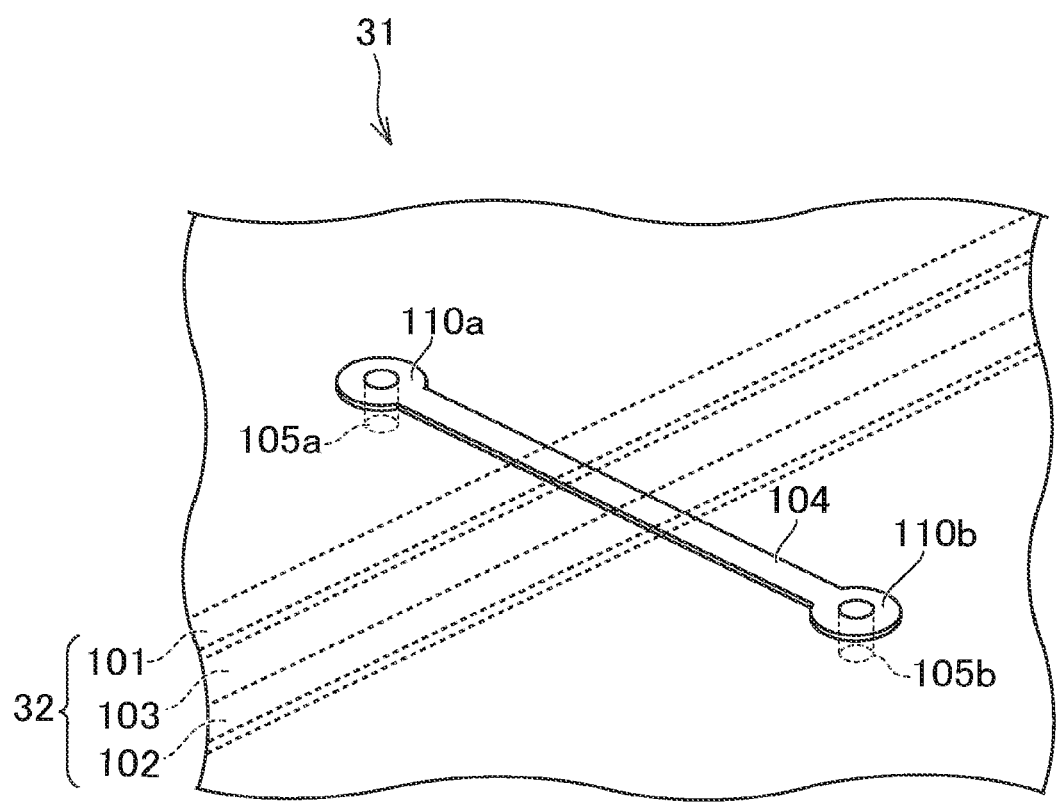
FIG. 16 is a schematic view illustrating a structure of a portion of a print circuit board according to a seventh embodiment of the present invention.
Figure 17:
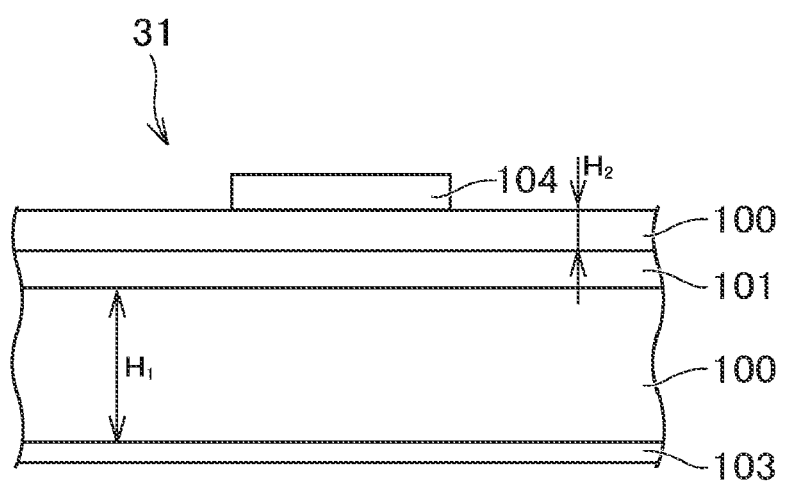
FIG. 17 is a schematic view illustrating a cross section of the portion of the print circuit board according to the seventh embodiment of the present invention.

FIG. 16 is a schematic view (perspective view) illustrating a structure of a portion of a print circuit board 31 according to a seventh embodiment of the present invention. FIG. 17 is a schematic view illustrating a cross section of the portion of the print circuit board 31 according to the seventh embodiment. Although in the print circuit board 31 according to the seventh embodiment, the shapes of the first resonator conductor 104 and the pair of first via holes 105a and 105b are different from these of the fifth embodiment, the other structure is the same as that of the fifth embodiment.

Although the planar shape of the first resonator conductor 104 according to the seventh embodiment coincides with the planar shape of the first resonator conductor 104 according to the fifth embodiment, as illustrated in FIG. 17, in the multi layer structure of the print circuit board 31, the first resonator conductor 104 according to the seventh embodiment is disposed in the uppermost metal layer, and the pair of strip conductors 101 and 102 according to the seventh embodiment are disposed in the second metal layer. That is, the first resonator conductor 104 is disposed on the board surface side in the lamination orientation of the ground conductor layer 103, and the pair of strip conductors 101 and 102 are disposed between the first resonator conductor 104 and the ground conductor layer 103. The first resonator conductor 104 is disposed on the board surface side in the lamination orientation of the pair of strip conductors 101 and 102. The pair of first via holes 105a and 105b connects (land portions 110a and 110b at both ends of) the first resonator conductor 104 and the ground conductor layer 103, respectively.

Here, the distance $H_1$ between the pair of strip conductors 101 and 102 and the ground conductor layer 103 is 138 µm, and the distance $H_2$ between the pair of strip conductors 101 and 102 and the first resonator conductor 104 is 65 µm. As described above, the distance $H_1$ is desirably twice or more the distance $H_2$, and the print circuit board 31 according to the seventh embodiment satisfies such a condition. The width W of the pair of strip conductors 101 and 102 is 0.20 mm, and the interval G between the pair of strip conductors 101 and 102 is 0.20 mm. The distance between the centers D of the pair of first via holes 105a and 105b is 3.05 mm, and the width $W_1$ of the first resonator conductor 104 is 0.19 mm.

Although in the print circuit board 31 according to the seventh embodiment, the layer on which the first resonator conductor 104 is disposed is different from these of the print circuit boards 31 according to the first to sixth embodiments, the print circuit board 31 according to the seventh embodiment has the same effects as that of the first embodiment. The configuration in which the first resonator conductor 104 and the second resonator conductor 114 are disposed further above the pair of strip conductors 101 and 102 is not limited to the seventh embodiment, and may be applied to each of the second to sixth embodiments.

Hereinbefore, the print circuit board, the optical module, and the optical transmission equipment according to the embodiments of the present invention are described. The present invention is not limited to the above embodiments and may be widely applied to a print circuit board having a resonator structure and a differential transmission line of a micro-strip line type. Although the print circuit board according to the present invention is the print circuit board provided in the optical transmission equipment and the optical module, the print circuit board may be provided in another equipment. In addition, although in the print circuit board according to the embodiments of the present invention, the case where the bit rate of the digital electric signal transmitted through each channel is 25.78 Gbit/s is described, it is not limited to such a bit rate and is suitable for a further higher bit rate.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A printed circuit board comprising:
a ground conductor layer;
a pair of strip conductors disposed on a board surface side of the ground conductor layer and extending along a first orientation;
a resonator conductor disposed between the ground conductor layer and the pair of strip conductors,
wherein the resonator conductor comprises a first circular land portion and a second circular land portion,
wherein the resonator conductor comprises a linear shape extending along a second orientation across the pair of strip conductors, and
wherein the linear shape has a first dimension in the first orientation and a second dimension in the second orientation,
the second dimension being longer than the first dimension;
a pair of via holes connecting the resonator conductor and the ground conductor layer; and
a dielectric layer disposed between the ground conductor layer and the pair of strip conductors,
wherein the resonator conductor is disposed inside the dielectric layer, and wherein a differential transmission line of a micro-strip line type in which a digital modulation signal is transmitted is configured by the ground conductor layer, the pair of strip conductors, and the dielectric layer.

2. The printed circuit board of claim 1, further comprising:
a dielectric film covering an uppermost layer of the printed circuit board,
wherein the pair of strip conductors are disposed between the dielectric film and the dielectric layer.

3. The printed circuit board of claim 1, wherein a distance between the pair of strip conductors and the ground conductor layer is twice or more a distance between the pair of strip conductors and the resonator conductor.

4. The printed circuit board of claim 1, wherein the resonator conductor comprises the linear shape extending from a first via hole, of the pair of via holes, towards a second via hole, of the pair of via holes, along the second orientation across the pair of strip conductors.

5. The printed circuit board of claim 1, wherein a first portion of the resonator conductor comprises the linear shape extending along the second orientation across the pair of strip conductors;
wherein a second portion of the resonator conductor extends from a first via hole, of the pair of via holes, towards a second via hole of the pair of via holes along the second orientation, and bends in a direction along the first orientation; and
wherein a third portion of the resonator conductor extends from the second via hole towards the first via hole along the second orientation, and bends in the direction along the first orientation.

6. The printed circuit board of claim 5, wherein the first portion connects the second portion and the third portion.

7. The printed circuit board of claim 1, wherein a first portion of the resonator conductor comprises the linear shape extending along the second orientation across the pair of strip conductors;
wherein a second portion of the resonator conductor extends from a first via hole, of the pair of via holes, and away from a second via hole of the pair of via holes along the second orientation, and bends in a direction along the first orientation; and
wherein a third portion of the resonator conductor extends from the second via hole and away from the first via hole along the second orientation, and bends in the direction along the first orientation.

8. The printed circuit board of claim 7, wherein the first portion connects the second portion and the third portion.

9. The printed circuit board of claim 1, wherein the resonator conductor comprises the linear shape extending from the first circular land portion towards the second circular land portion along the second orientation across the pair of strip conductors.

10. The printed circuit board of claim 1, wherein a first portion of the resonator conductor comprises the linear shape extending along the second orientation across the pair of strip conductors;
wherein a second portion of the resonator conductor extends from the first circular land portion towards the second circular land portion along the second orientation and bends in a direction along the first orientation; and
wherein a third portion of the resonator conductor extends from the second circular land portion towards the first circular land portion along the second orientation and bends in the direction along the first orientation.

11. The printed circuit board of claim 10, wherein the first portion connects the second portion and the third portion.

12. The printed circuit board of claim 1, wherein a first portion of the resonator conductor comprises the linear shape extending along the second orientation across the pair of strip conductors;
wherein a second portion of the resonator conductor extends from the first circular land portion and away from the second circular land portion along the second orientation, and bends in a direction along the first orientation; and
wherein a third portion of the resonator conductor extends from the second circular land portion and away from the first circular land portion along the second orientation, and bends in the direction along the first orientation.

13. The printed circuit board of claim 12, wherein the first portion connects the second portion and the third portion.

14. The printed circuit board of claim 1, wherein a resonator structure is configured to include the ground conductor layer, the resonator conductor, and the pair of via holes.

15. A printed circuit board comprising:
a ground conductor layer;
a pair of strip conductors disposed to extend along a first orientation;
a resonator conductor disposed on a board surface side of the printed circuit board,
wherein the pair of strip conductors are disposed between the resonator conductor and the ground conductor layer,
wherein the resonator conductor comprises a linear shape extending along a second orientation across the pair of strip conductors, and
wherein the linear shape has a first dimension in the first orientation and a second dimension in the second orientation,
the second dimension being longer than the first dimension;
a pair of via holes connecting the resonator conductor and the ground conductor layer; and
a dielectric layer disposed between the ground conductor layer and the pair of strip conductors,
wherein a differential transmission line of a micro-strip line type in which a digital modulation signal is transmitted is configured by the ground conductor layer, the pair of strip conductors, and the dielectric layer.

16. The printed circuit board of claim 15, wherein the resonator conductor comprises the linear shape extending from a first via hole, of the pair of via holes, towards a second via hole, of the pair of via holes, along the second orientation across the pair of strip conductors.

17. The printed circuit board of claim 15, wherein a first portion of the resonator conductor comprises the linear shape extending along the second orientation across the pair of strip conductors;
wherein a second portion of the resonator conductor extends from a first via hole, of the pair of via holes, and away from a second via hole of the pair of via holes along the second orientation, and bends in a direction along the first orientation; and
wherein a third portion of the resonator conductor extends from the second via hole and away from the first via hole along the second orientation, and bends in the direction along the first orientation.

18. The printed circuit board of claim 17, wherein the first portion connects the second portion and the third portion.

19. The printed circuit board of claim 15, wherein the resonator conductor comprises a first circular land portion and a second circular land portion.

20. The printed circuit board of claim 19, wherein a first portion of the resonator conductor comprises the linear shape extending along the second orientation across the pair of strip conductors;

wherein a second portion of the resonator conductor extends from the first circular land portion and away from the second circular land portion along the second orientation, and bends in a direction along the first orientation;

wherein a third portion of the resonator conductor extends from the second circular land portion away from the first circular land portion along the second orientation, and bends in the direction along the first orientation; and wherein the first portion connects the second portion and the third portion.

\* \* \* \* \*